(12) United States Patent
Wakisaka

(10) Patent No.: US 8,487,443 B2
(45) Date of Patent: *Jul. 16, 2013

(54) SEMICONDUCTOR STRUCTURE, MANUFACTURING METHOD OF SEMICONDUCTOR STRUCTURE AND SEMICONDUCTOR DEVICE

(75) Inventor: Shinji Wakisaka, Hanno (JP)

(73) Assignee: Teramikros, Inc., Tokyo (JP)

( * ) Notice: Subject to any disclaimer, the term of this patent is extended or adjusted under 35 U.S.C. 154(b) by 31 days.

This patent is subject to a terminal disclaimer.

(21) Appl. No.: 13/074,233

(22) Filed: Mar. 29, 2011

(65) Prior Publication Data

US 2011/0233739 A1    Sep. 29, 2011

(30) Foreign Application Priority Data

Mar. 29, 2010   (JP) .................. 2010-075037

(51) Int. Cl.
*H01L 23/48*   (2006.01)

(52) U.S. Cl.
USPC .... 257/773; 257/698; 257/693; 257/E23.011; 257/E21.499; 257/E21.5; 257/E21.575

(58) Field of Classification Search
USPC .......... 257/737, 738, E23.021, E23.069, 257/698, 693, 773, E23.011, E21.499, 678, 257/780, 781, E21.5, E21.575
See application file for complete search history.

(56) References Cited

U.S. PATENT DOCUMENTS

| | | | |
|---|---|---|---|
| 5,545,849 A | 8/1996 | Kondo | |
| 7,618,886 B2 | 11/2009 | Jobetto et al. | |
| 8,319,346 B2 * | 11/2012 | Wakisaka | 257/773 |
| 2004/0104478 A1 * | 6/2004 | Noguchi | 257/738 |
| 2006/0006511 A1 | 1/2006 | Roh et al. | |
| 2007/0069232 A1 | 3/2007 | Kameyama et al. | |
| 2011/0233787 A1 | 9/2011 | Wakisaka | |

FOREIGN PATENT DOCUMENTS

| | | |
|---|---|---|
| JP | 2004-209585 A | 7/2004 |
| JP | 2005-109221 A | 4/2005 |
| JP | 2009-072848 A | 4/2009 |

OTHER PUBLICATIONS

U.S. Appl. No. 13/074,279, see claims 1, 2, and 4-7, dated Jul. 17, 2012, Shinij Wakisaka, Japan, Mar. 29, 2011.*
U.S. Appl. No. 13/074,279; First Named Inventor: Shinji Wakisaka; Title: "Semiconductor Structure and Manufacturing Method of Semiconductor Structure"; Filed: Mar. 29, 2011.

* cited by examiner

*Primary Examiner* — Jasmine Clark
(74) *Attorney, Agent, or Firm* — Holtz, Holtz, Goodman & Chick, PC

(57) ABSTRACT

Disclosed is a semiconductor structure including a semiconductor substrate including an electronic circuit which is provided in a predetermined region of the semiconductor substrate, a wiring provided on the semiconductor substrate in a region outside of the predetermined region, an external connection electrode provided on the wiring, a sealing resin which covers a side surface of the external connection electrode and a wall which intervenes between the electronic circuit and the sealing resin.

14 Claims, 28 Drawing Sheets

SEMICONDUCTOR STRUCTURE, MANUFACTURING METHOD OF SEMICONDUCTOR STRUCTURE AND SEMICONDUCTOR DEVICE

BACKGROUND OF THE INVENTION

1. Field of the Invention

The present invention relates to a semiconductor structure, a manufacturing method of the semiconductor structure and a semiconductor device in which the semiconductor structure is packaged.

2. Description of the Related Art

There is suggested an electronic circuit which is a semiconductor structure in which a special electronic circuit having MEMS (Micro Electro Mechanical Systems) is formed in a region of a semiconductor wafer in addition to a general electronic circuit (for example, see JP2005-109221). For example, MEMS is a mechanical device such as an acceleration sensor (for example, see JP2009-72848), a cantilever (for example, see JP2004-209585) and the like or an optical device.

SUMMARY OF THE INVENTION

In a package of the semiconductor structure having a mechanical device as described above, a space for the mechanical device to operate is needed. Further, in a package of the semiconductor structure having an optical device, a place where light enters or exits is needed.

An advantage of the present invention is to improve the productivity of the semiconductor device in which the semiconductor structure needing a space around the electronic circuit is embedded.

A semiconductor structure of the present invention includes a semiconductor substrate including an electronic circuit which is provided in a predetermined region of the semiconductor substrate, a wiring provided on the semiconductor substrate in a region outside of the predetermined region, an external connection electrode provided on the wiring, a sealing resin which covers a side surface of the external connection electrode and a wall which intervenes between the electronic circuit and the sealing resin.

According to the present invention, the productivity of the semiconductor structure which needs a space around the electronic circuit and the semiconductor device which includes the semiconductor structure can be improved.

BRIEF DESCRIPTION OF THE DRAWINGS

The present invention will become more fully understood from the detailed description given hereinbelow and the appended drawings which are given by way of illustration only, and thus are not intended as a definition of the limits of the present invention, and wherein.

DETAILED DESCRIPTION OF THE PREFERRED EMBODIMENTS

First Embodiment

Figure 1:
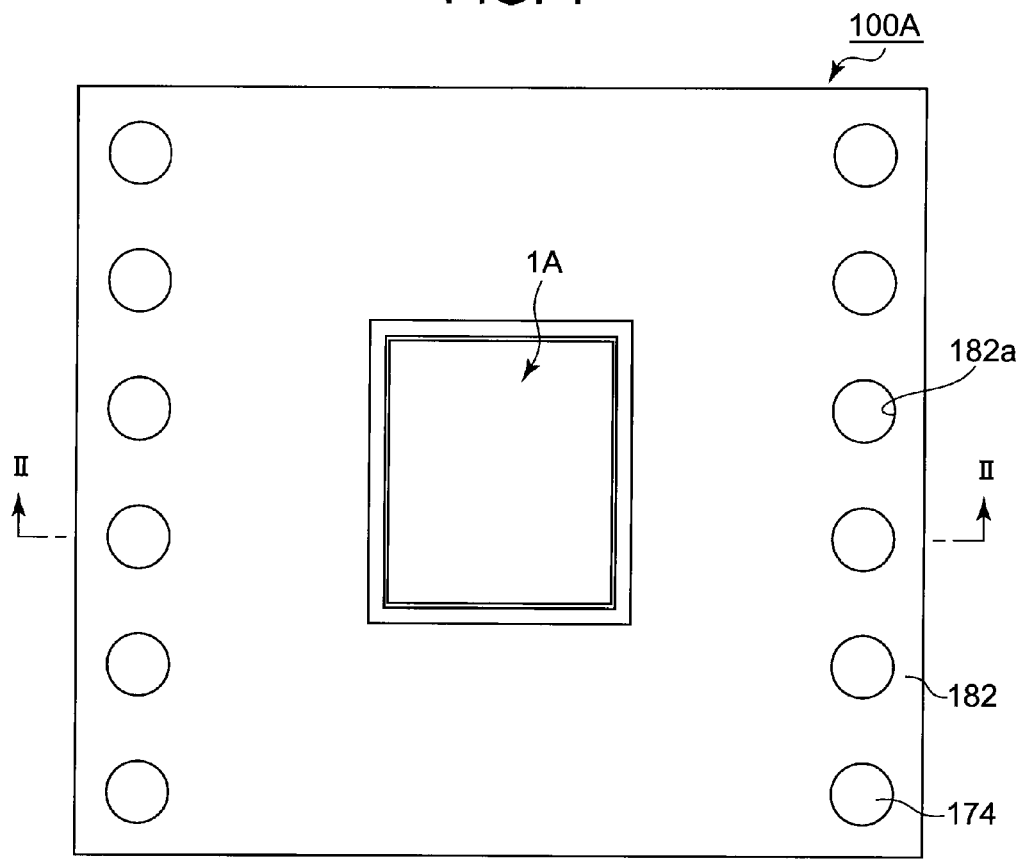
FIG. 1 is a plan view showing a semiconductor device 100A according to the first embodiment of the present invention.
Figure 2:
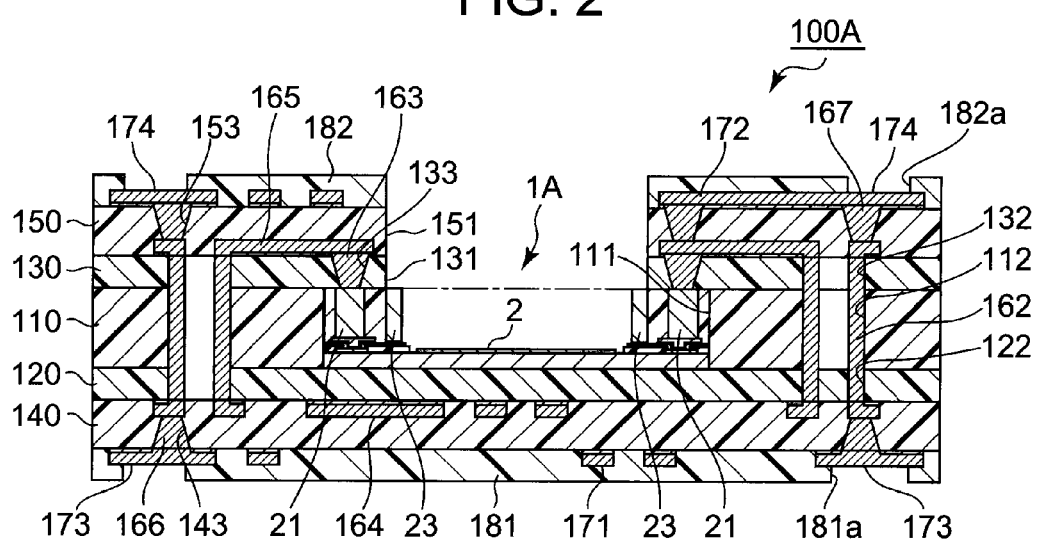
FIG. 2 is a cross-sectional view when cut along the line II-II in FIG. 1.

FIG. 1 is a plan view showing a semiconductor device 100A according to the first embodiment of the present invention and FIG. 2 is a cross-sectional view when cut along the line II-II in FIG. 1. The semiconductor device 100A is a layered structure in which insulating layers 110, 120, 130, 140 and 150 which are wiring boards are layered, and a semiconductor structure 1A is packaged in the semiconductor device 100A.

Here, the semiconductor structure 1A will be described.

Figure 3:
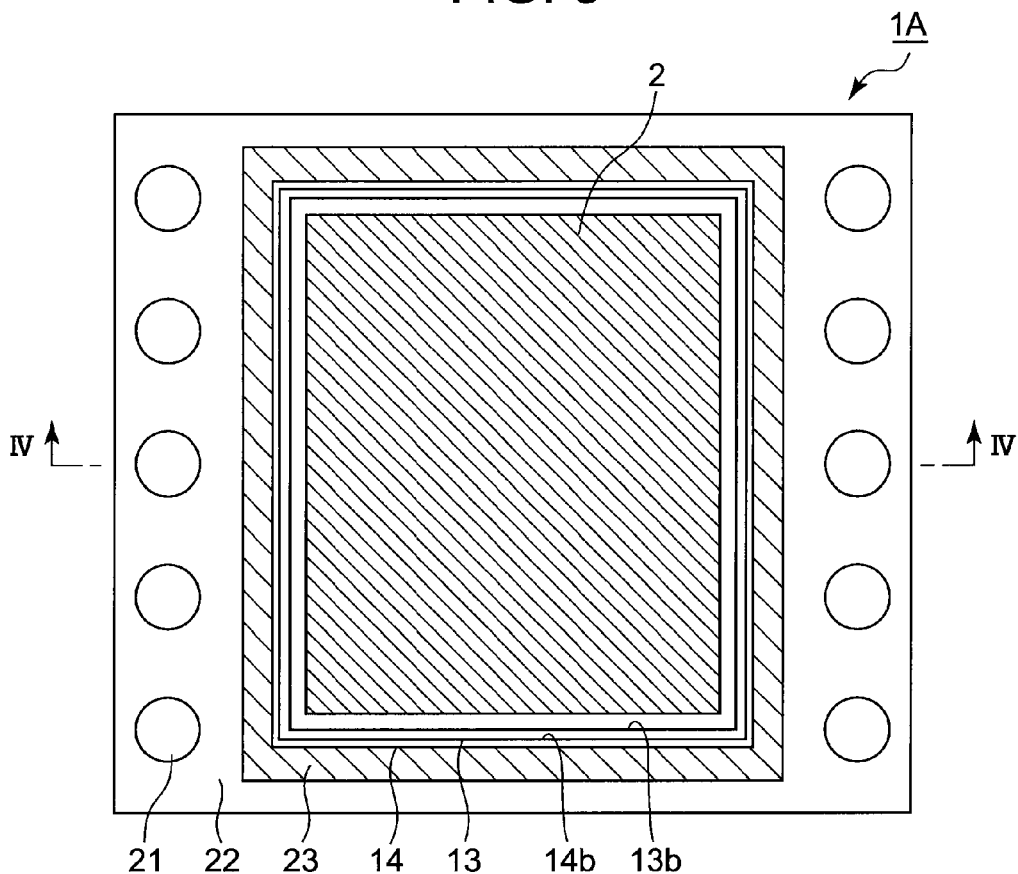
FIG. 3 is a plan view showing a semiconductor structure 1A according to the first embodiment of the present invention.
Figure 4:
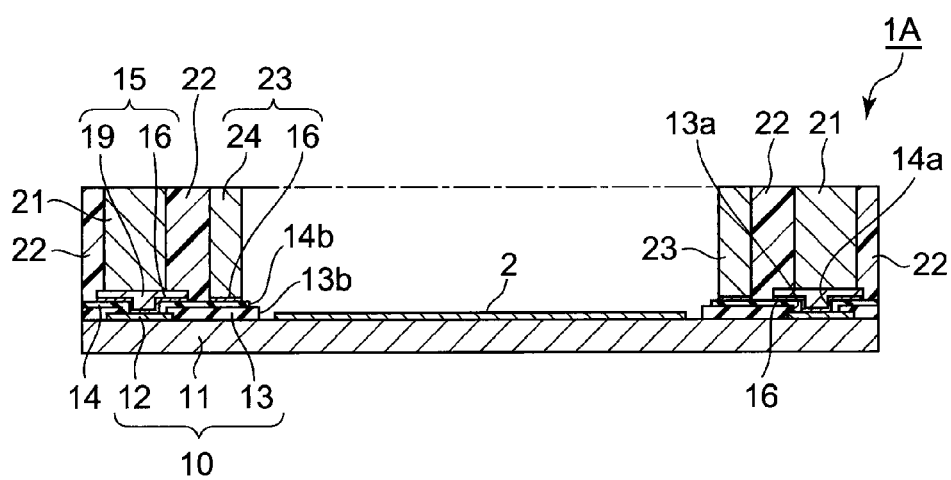
FIG. 4 is a cross-sectional view when cut along the line IV-IV in FIG. 3.

FIG. 3 is a plan view showing the semiconductor structure 1A and FIG. 4 is a cross-sectional view when cut along the line IV-IV in FIG. 3. As shown in FIGS. 3 and 4, the semiconductor structure 1A includes an insulating film 14, a plurality of wirings 15, a plurality of external connection electrodes 21, a sealing resin 22, a wall 23 and the like on the surface of the semiconductor substrate 10.

As shown in FIG. 4, the semiconductor substrate 10 includes a silicon substrate 11, a plurality of connection pads 12 formed of a conductive material such as metal and a protective insulating film 13 formed of an insulating material such as oxide silicon, nitride silicon or the like.

In one surface-side of the silicon substrate 11, the connection pads 12 being provided in the one surface-side of the silicon substrate 11, a device region and a wiring region are provided. The device region is the region inside of the wall 23 and an electronic circuit 2 is arranged in the device region. The wiring region is the region outside of the wall 23 and the connection pads 12, the external connection electrodes 21 and the wirings 15 which connect the connection pads 12 and the external connection electrodes 21, and the like are formed in the wiring region. For example, the electronic circuit 2 is an acceleration sensor, a pressure sensor, a micro gyro, a flow sensor, a gas sensor, an infrared imager, a microactuator, an ink-jet printer head, a resonator filter, a miniature relay, a micro-prober, a scanning probe microscope, an optical switch, a digital mirror device, an optical scanner, an optical sensor or the like.

The connection pads 12 are connected with a wiring (not shown in the drawing) on the silicon substrate 11. The protective insulating film 13 is formed on the one surface of the silicon substrate 11 and covers the wirings and the like on the silicon substrate 11.

Further, a plurality of openings 13a for exposing the connection pads 12 and an opening 13b for exposing the electronic circuit 2 are provided in the protective insulating film 13. As shown in FIGS. 3 and 4, the openings 13a are smaller than the connection pads 12 and the opening 13b is larger than the electronic circuit 2.

The insulating film 14 which is formed of epoxy resin, polyimide resin or the like is formed on the upper surface of the protective insulating film 13. As for the insulating film 14, a highly functional plastic material such as polyimide, polybenzoxazole (PBO) or the like, a plastic material of epoxy system, phenolic system, silicon system or the like, or a composite material of the above mentioned materials can be used.

A plurality of openings 14a for exposing the connection pads 12 and an opening 14b for exposing the electronic circuit 2 are provided in the insulating film 14. When the insulating film 14 is formed of photosensitive resin, the openings 14a and 14b can be formed at once by applying the photosensitive resin on the semiconductor substrate 10 and by exposing, developing and curing the photosensitive resin thereon. Further, for example, the openings 14a and 14b can be formed by irradiating a laser to the insulating film 14. As shown in FIGS. 3 and 4, the openings 14a of the insulating film 14 are smaller than the openings 13a of the protective insulating film 13, and the connection pads 12 and the insulating film 14 are in close contact with each other at peripheries of the openings 14a. Further, the opening 14b of the insulating film 14 is larger than the electronic circuit 2, and the electronic circuit 2 is exposed at the opening 14b of the insulating film 14.

Each of a plurality of wirings 15 is formed on each of the connection pads 12. Each of center portions of the connection pads 12 is exposed and each of peripheral portions of the connection pads 12 is covered with the insulating film 14.

Each of the wirings 15 includes an electroplating seed layer 16 which is a lower layer including copper or the like which becomes a core for electroplating an upper layer and a wiring layer 19 which is the upper layer including a conductive material such as copper. Preferably, the electroplating seed layer 16 has a thickness of 200 nm to 2000 nm. In each wiring 15, a part of the electroplating seed layer 16 is connected to the connection pad 12 via the openings 13a and 14a. The wirings 15 are wirings for making the electronic circuit 2 and other electronic circuit such as a transistor of the silicon substrate 11 of the semiconductor structure 1A be conductive with the external connection electrodes 21.

On the upper surface of the electroplating seed layer 16, a wiring layer 19 formed of a conductive material such as copper and a wall layer 24 are formed.

The wiring layer 19 is thicker than the electroplating seed layer 16, and preferably, the thickness is 1 µm to 5 µm, for example. With respect to each of the wirings 15, a land is formed at the end part of the wiring 15 on the opposite side of the connection pad 12 and an external connection electrode 21 formed of a conductive material such as copper is formed on the land. The plurality of external connection electrodes 21 are arranged along two sides of the semiconductor structure 1A formed in an approximately rectangular shape when seen planarly from above, wherein the two sides are facing each other. The external connection electrodes 21 which are arranged along each side are arranged in one line or in a plurality of lines. Each of the external connection electrodes 21 is formed in a columnar shape and the diameter of each of the external connection electrodes 21 is 50 to 500 µm. The height of each of the external connection electrodes 21 is about 45 to 99 µm and is about 50 to 100 µm when combined with the thickness of the wiring 15.

Each of the wirings 15 which is a layered structure of the electroplating seed layer 16 and the wiring layer 19 connects one or a plurality of connection pads 12 and one or a plurality of external connection electrodes 21 which correspond to the wiring 15. Further, the wirings 15 are arranged so as to be electrically insulated from other wirings 15 adjacent to each other.

The wall 23 is provided so as to encircle the openings 13b and 14b and is formed in a rectangular shape seen planarly from above. The wall 23 includes the electroplating seed layer 16 which is the lower layer including copper or the like which becomes a core for electroplating the upper layer and the wall layer 24 which is the upper layer including a conductive material such as copper or the like. The width of the wall 23 is 70 to 100 µm. The height of the wall 23 is about 50 to 100 µm. Preferably, the surfaces of the wall 23 and external connection electrodes 21 are at the same surface level with each other. That is, it is preferred that the surfaces of the wall 23 and external connection electrodes 21 are at the same height level.

Because the protective insulating film 13 is intervened between the wall 23 and the silicon substrate 11, therefore, the wall 23 is insulated from the electronic circuit 2 and other electronic circuit such as a transistor or the like of the silicon substrate 11 of the semiconductor structure 1A.

Here, one of the wirings 15 (a wiring for grounding) which is connected with the connection pad 12 (a connection pad for grounding) which is grounded extends to the lower part of the wall 23 and any one of the external connection electrodes 21 is conductive with the wall 23 via this wiring 15. This external connection electrode 21 is a terminal for grounding and grounds the wall 23.

In the region around the external connection electrodes 21 outside of the wall 23 (a wiring region), the region being on the surfaces of the wirings 15 and the insulating film 14, a sealing resin 22 is filled. For example, the sealing resin 22 is a composite (composite material) of a heat-curable resin such as heat-curable polyimide, epoxy resin, phenol resin or the like and a filler such as silica or the like. However, a heat-curable resin not containing a filler may also be used. The upper surfaces of the external connection electrodes 21 are exposed from the sealing resin 22.

That is, the wall 23 functions as a partition so that the sealing resin 22 or a material which becomes the sealing resin 22 does not enter the device region inside of the wall 23 by intervening between the electronic circuit 2 and the sealing resin 22.

Figure 13:
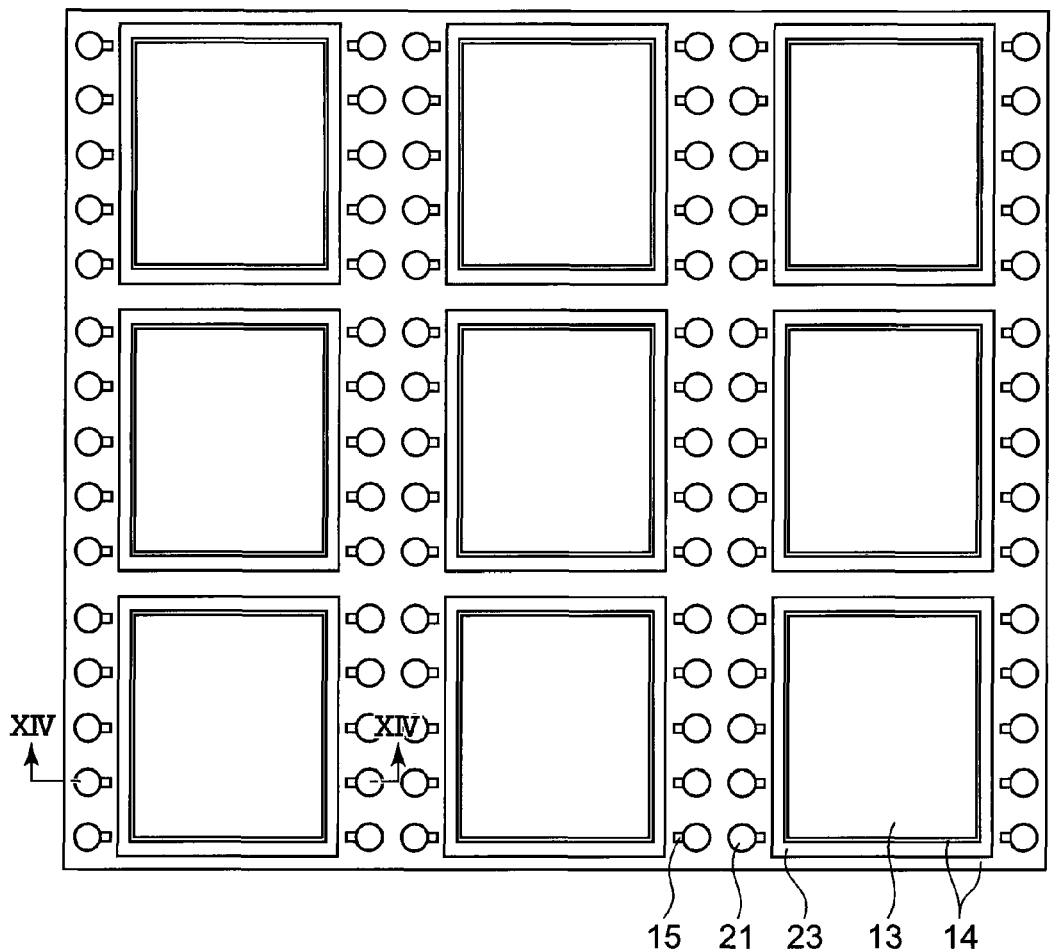
FIG. 13 is a plan view showing a silicon substrate in the middle of manufacturing the semiconductor structure 1A before dice cutting is carried out.
Figure 14:
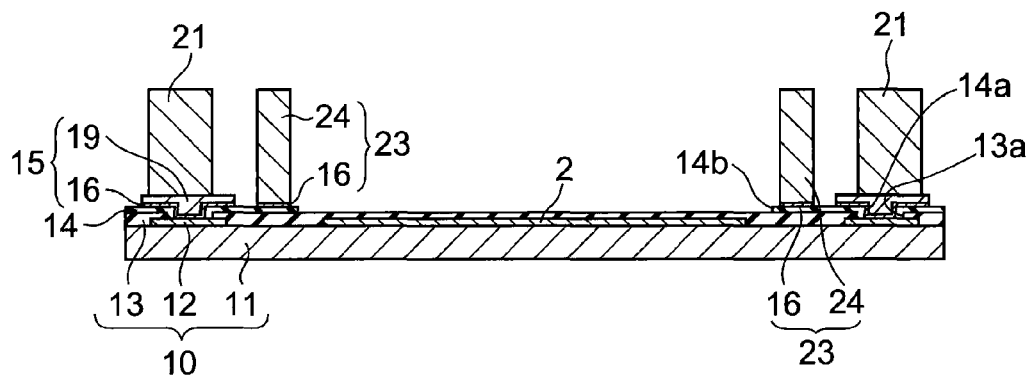
FIG. 14 is a cross-sectional view when cut along the line XIV-XIV in FIG. 13.
Figure 15:
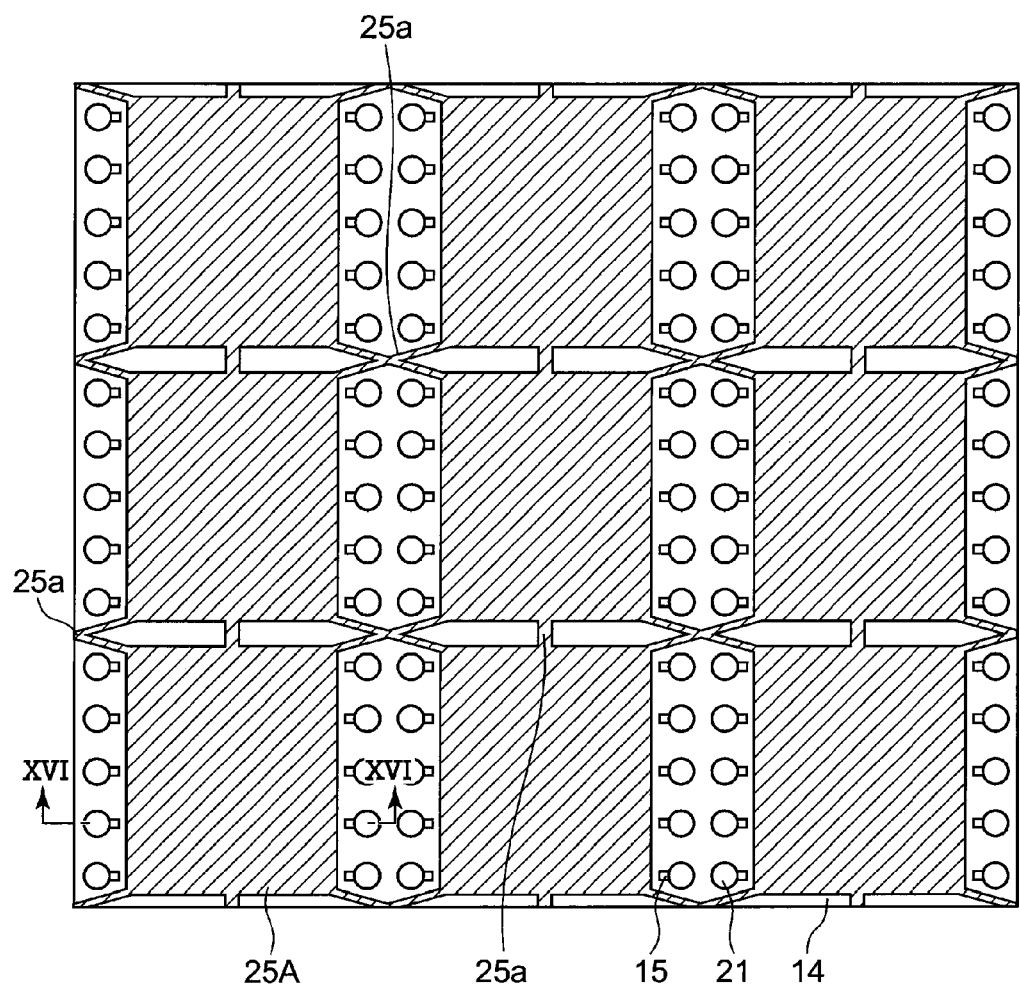
FIG. 15 is a plan view showing the silicon substrate in the middle of manufacturing the semiconductor structure 1A before dice cutting is carried out.
Figure 16:
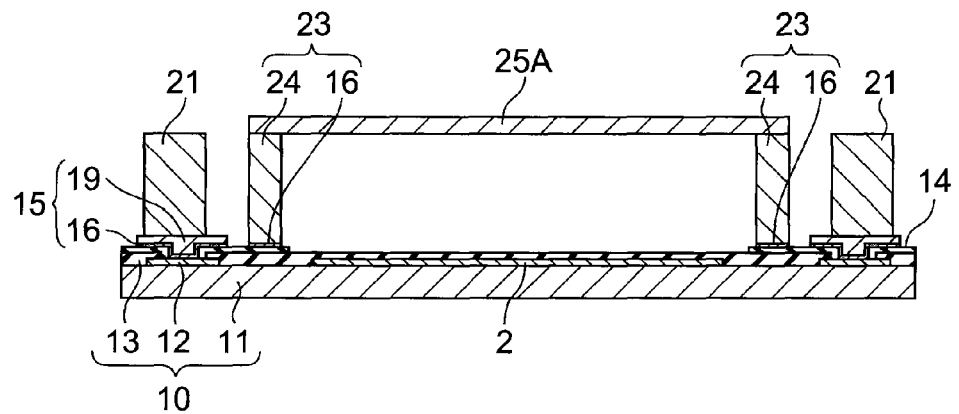
FIG. 16 is a cross-sectional view when cut along the line XVI-XVI in FIG. 15.
Figure 17:
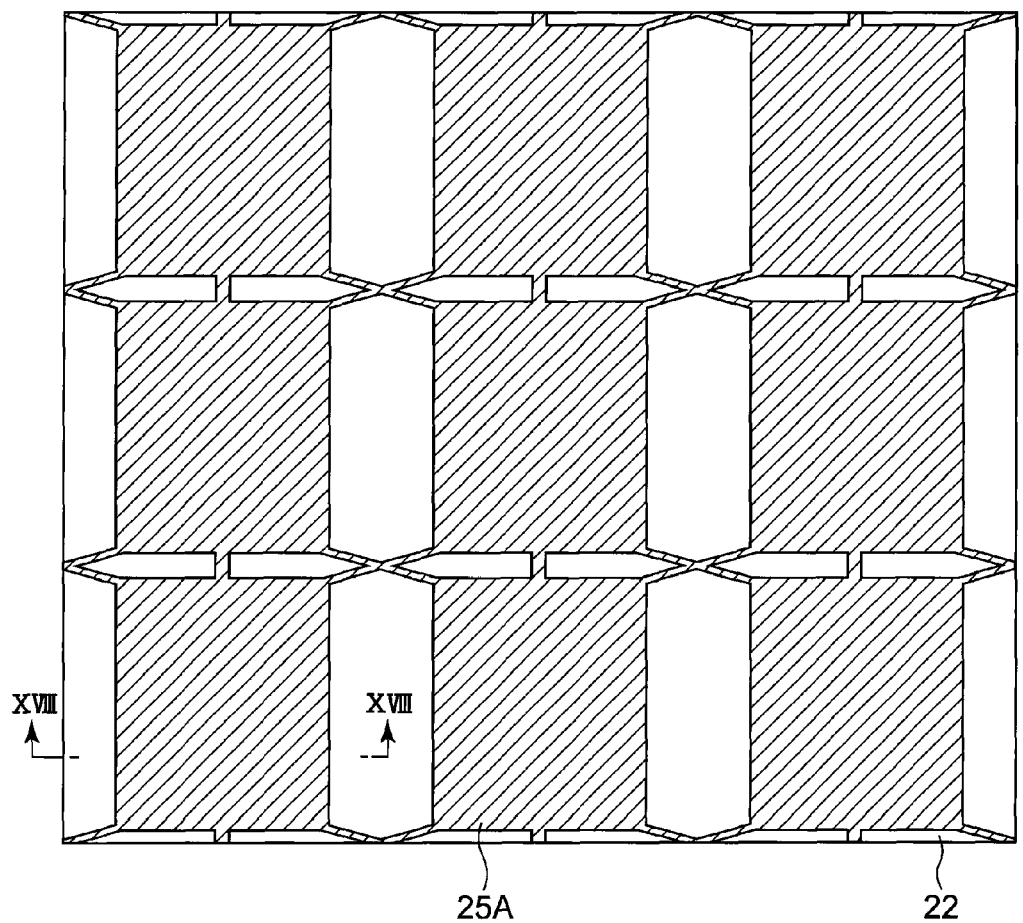
FIG. 17 is a plan view showing the silicon substrate in the middle of manufacturing the semiconductor structure 1A before dice cutting is carried out.
Figure 18:
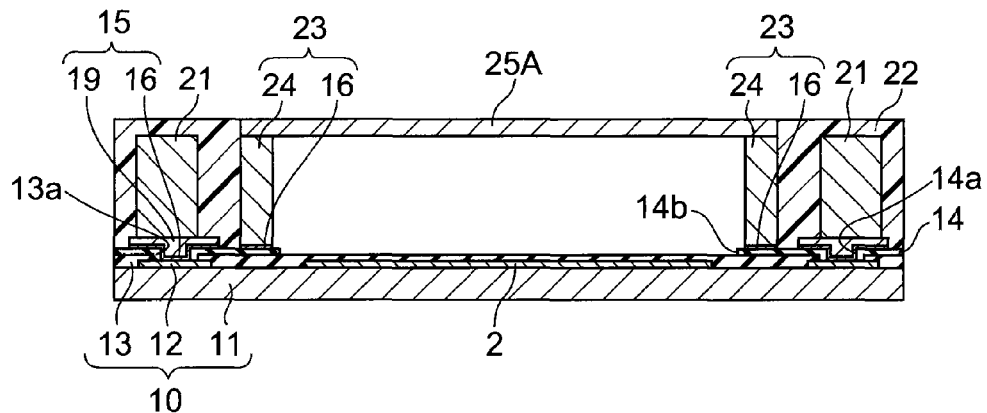
FIG. 18 is a cross-sectional view when cut along the line XVIII-XVIII in FIG. 17.

Next, a manufacturing method of the semiconductor structure 1A will be described by using FIGS. 5 to 20. Here, FIGS. 5 to 12 are cross-sectional diagrams of the silicon substrate in a state of wafer in the middle of manufacturing before dice cutting is carried out. Further, FIGS. 13, 15, 17 and 19 are plan views showing the silicon substrate in the state of wafer in the middle of manufacturing of the semiconductor structure 1A before dice cutting is carried out, FIG. 14 is a cross-sectional view when cut along the line XIV-XIV in FIG. 13, FIG. 16 is a cross-sectional view when cut along the line XVI-XVI in FIG. 15, FIG. 18 is a cross-sectional view when cut along the line XVIII-XVIII in FIG. 17 and FIG. 20 is a cross-sectional view when cut along the line XX-XX in FIG. 19.

Figure 5:
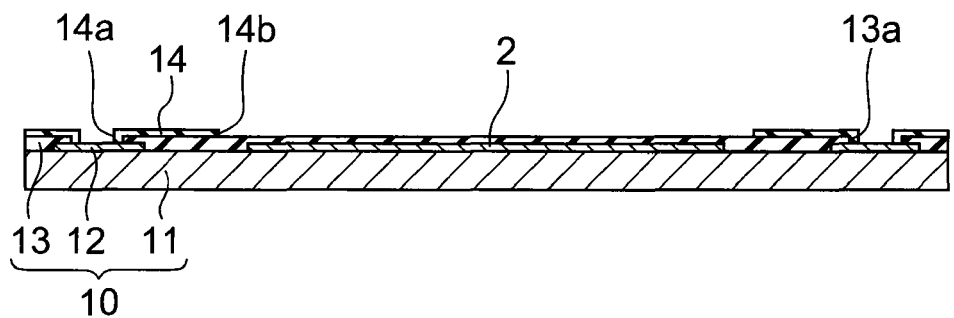
FIG. 5 is an explanatory diagram of a manufacturing method of the semiconductor structure 1A.

First, as shown in FIG. 5, on the surface of the semiconductor substrate 10 before dice cutting is carried out, in which connection pads 12 and a protective insulating film 13 are provided on a silicon substrate (semiconductor wafer) 11, an insulating film 14 is formed. Here, openings 13b for exposing the electronic circuits 2 are not yet provided in the protective insulating film 13, and the electronic circuits 2 are covered with the protective insulating film 13.

Figure 6:
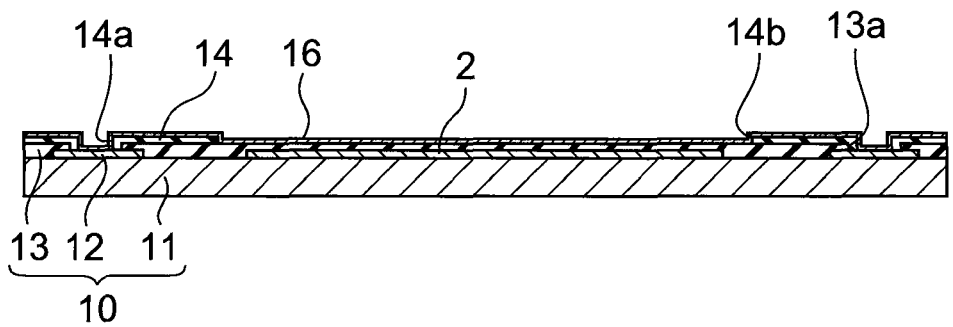
FIG. 6 is an explanatory diagram of the manufacturing method of the semiconductor structure 1A.

Next, as shown in FIG. 6, an electroplating seed layer 16 which covers the entire surface of the insulating film 14 and the connection pads 12 is formed by a vapor phase deposition method such as spattering or the like.

Figure 7:
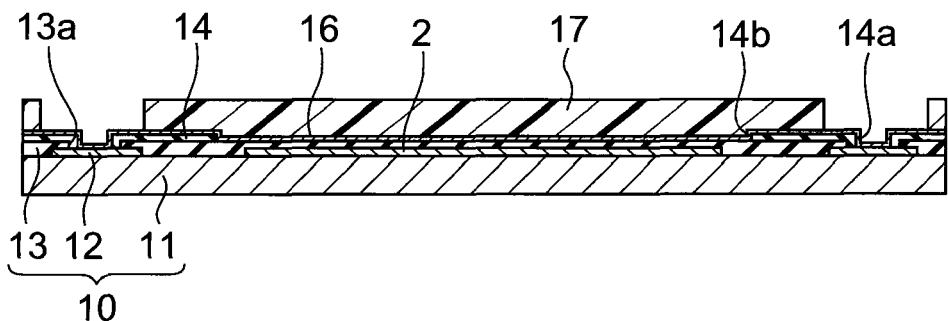
FIG. 7 is an explanatory diagram of the manufacturing method of the semiconductor structure 1A.

Thereafter, as shown in FIG. 7, a wiring resist 17 is formed on the electroplating seed layer 16 excluding the regions where the wiring layer 19 is to be formed.

Figure 8:
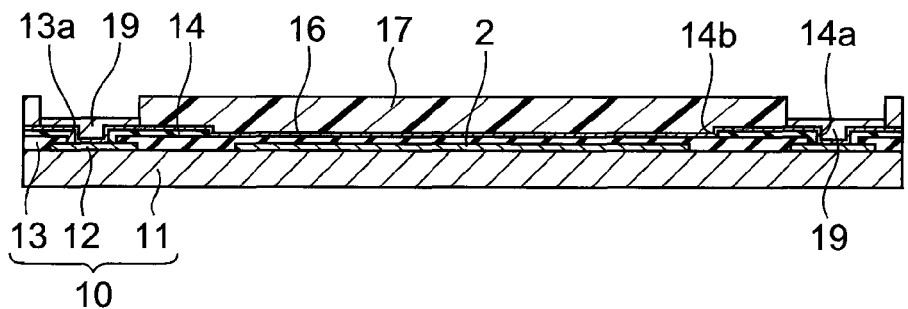
FIG. 8 is an explanatory diagram of the manufacturing method of the semiconductor structure 1A.

Next, as shown in FIG. 8, the wiring layer 19 is deposited at the regions where the wiring resist 17 is not formed by carrying out the electroplating in which the electroplating seed layer 16 is set as a negative electrode.

Figure 9:
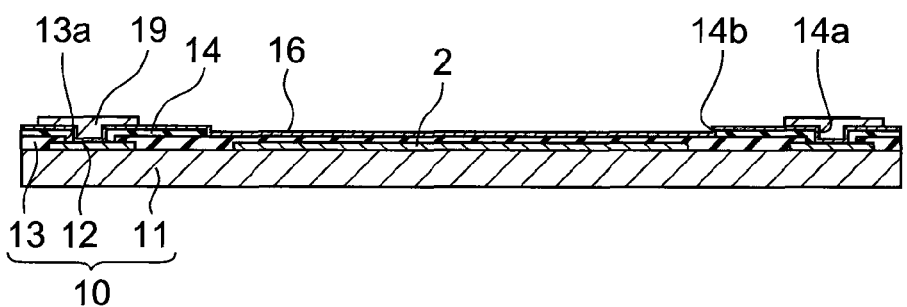
FIG. 9 is an explanatory diagram of the manufacturing method of the semiconductor structure 1A.

Thereafter, as shown in FIG. 9, the wiring resist 17 is removed.

Figure 10:
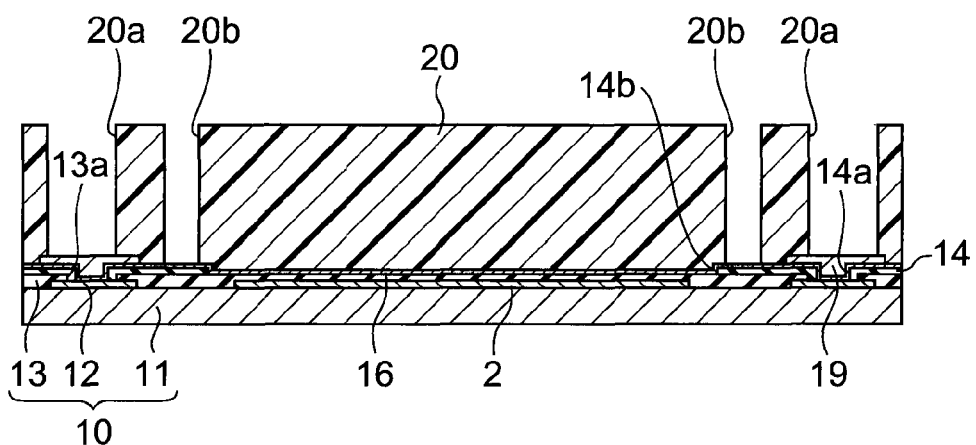
FIG. 10 is an explanatory diagram of the manufacturing method of the semiconductor structure 1A.

Next, as shown in FIG. 10, a resist 20 for the external connection electrodes 21 and the wall layer 24 is formed by attaching a dry film on the surface of the electroplating seed layer 16 and the wiring layer 19 and by patterning the dry film. Here, in the resist 20, a plurality of openings 20a are provided at the parts corresponding to where the plurality of external connection electrodes 21 are to be formed and openings 20b are provided at the parts corresponding to where the wall layer 24 is to be formed.

Figure 11:
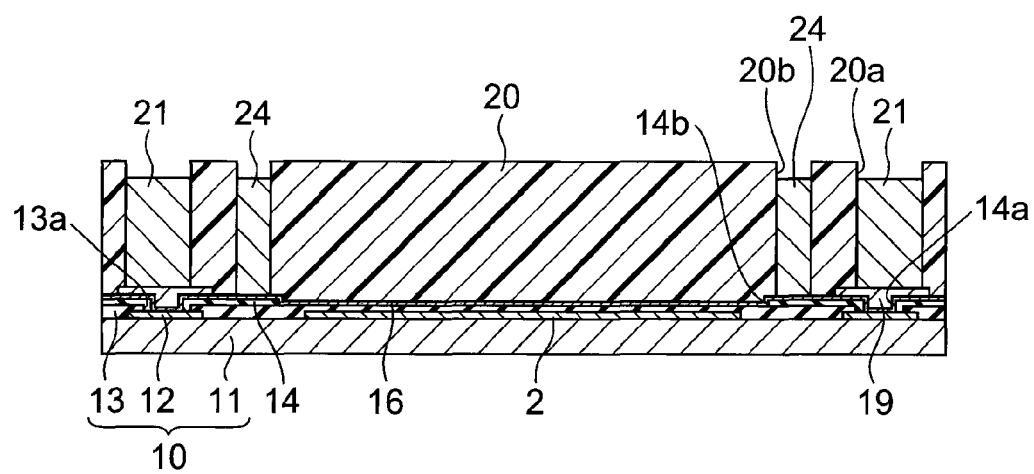
FIG. 11 is an explanatory diagram of the manufacturing method of the semiconductor structure 1A.

Thereafter, as shown in FIG. 11, by carrying out the electroplating in which the electroplating seed layer 16 is set as the negative electrode, the external connection electrodes 21 are formed by being deposited in the openings 20a of the resist 20 and the wall layer 24 is formed by being deposited in the openings 20b of the resist 20 at the same time. Therefore, the external connection electrodes 21 and the wall layer 24 are formed by the same material and are formed so as to have about the same height level. The external connection electrodes 21 and the wall layer 24 are preferably formed of copper in view of the specific resistance.

Figure 12:
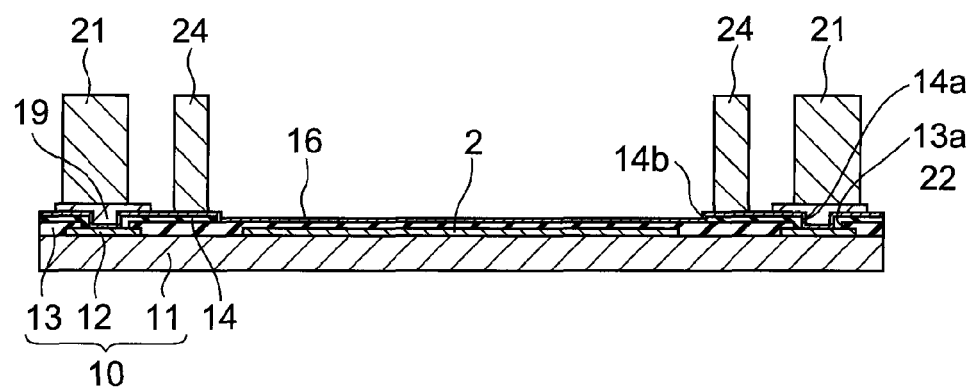
FIG. 12 is an explanatory diagram of the manufacturing method of the semiconductor structure 1A.

Next, as shown in FIG. 12, the resist 20 is removed.

Subsequently, as shown in FIGS. 13 and 14, the electroplating seed layer 16 at the regions where the wiring layer 19, the external connection electrodes 21 and the wall layer 24 are not formed is removed by carrying out soft etching. In such way, the wirings 15, each of which is a layered body of the wiring layer 19 and the electroplating seed layer 16 arranged below the wiring layer 19, and the walls 23, each of which is a layered body of the wall layer 24 and the electroplating seed layer 16 arranged below the wall layer 24, are formed.

At this time, the surfaces of the wiring layer 19, external connecting electrodes 21 and wall layer 24 are also etched for about the same thickness of the electroplating seed layer 16. However, because the wiring layer 19, the external connection electrodes 21 and the wall layer 24 are considerably thicker comparing to the electroplating seed layer 16, therefore, there is no affect.

Next, a visual inspection is carried out to confirm whether there are breaks in the wirings 15 or not and whether there are foreign substances on the semiconductor substrate 10 or not. Then, by carrying out the oxygen plasma treatment to the surface of the insulating film 14, foreign substances such as carbides and the like on the surface are removed.

Next, as shown in FIGS. 15 and 16, lids 25A which cover the regions inside of the walls 23 (the device regions where the electronic circuits 2 are arranged) are placed on the walls 23. As for the lids 25A, print mask plates formed of copper, stainless or the like can be used, for example. The lids 25A are connected to each other by connecting units 25a.

Thereafter, as shown in FIGS. 17 and 18, the sealing resin 22 is filled in the region outside of the walls 23 (the wiring region). The sealing resin 22 covers the upper parts of the external connection electrodes 21. At this time, because the regions inside of the walls 23 (the device regions) are covered with the lids 25A, the device regions will not be filled with the sealing resin 22. After the sealing resin 22 is cured, the lids 25A are removed.

Figure 19:
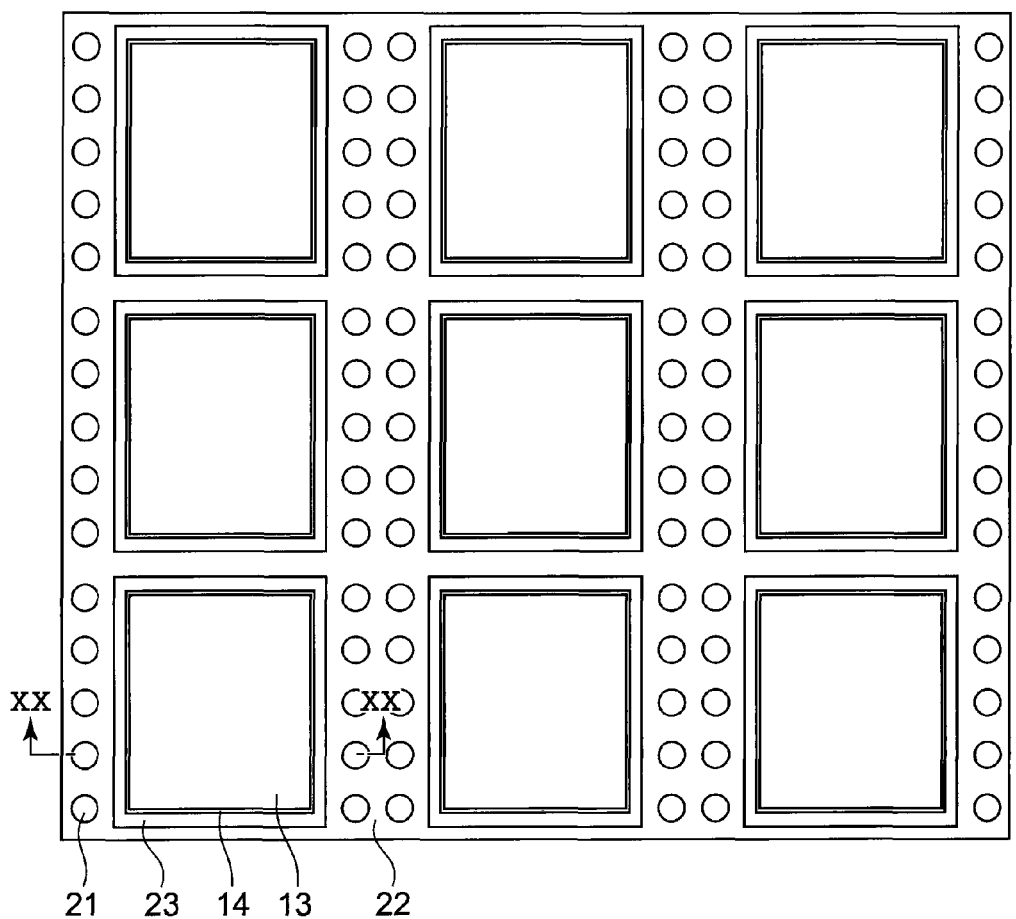
FIG. 19 is a plan view showing the silicon substrate in the middle of manufacturing the semiconductor structure 1A before dice cutting is carried out.
Figure 20:
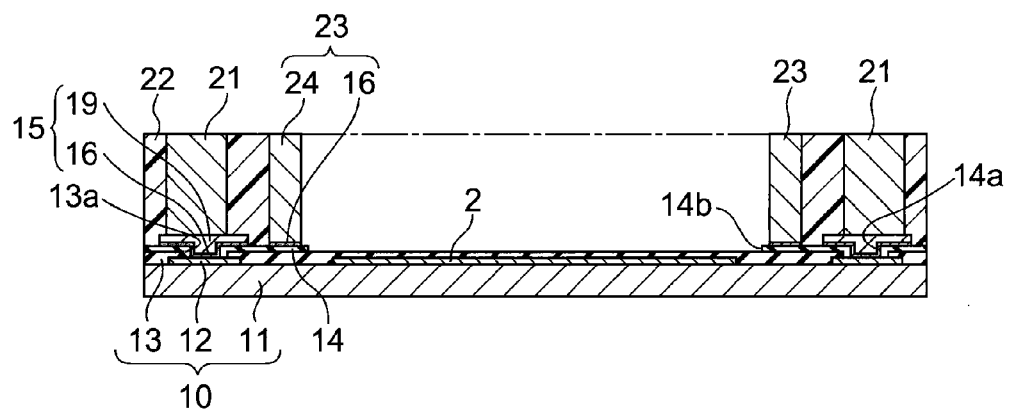
FIG. 20 is a cross-sectional view when cut along the line XX-XX in FIG. 19.

Then, by trimming the upper portions of the external connection electrodes 21 while trimming the sealing resin 22 from the upper surface by a grinder, the external connection electrodes 21, the sealing resin 22 and the walls 23 are formed so that the surfaces thereof are to be at the same surface level with each other as shown in FIGS. 19 and 20. In such way, even when the external connection electrodes 21 are formed to have various height levels at the time of the electroplating, the external connection electrodes 21 can have about the same height level. Here, in such cases where the sealing resin 22 is filled over to the upper parts of the lids 25A, the lids 25A may be trimmed together with the sealing resin 22 when the lids 25A cannot be removed. It is preferable that the surfaces of the external connection electrodes 21, sealing resin 22 and walls 23 are at the same height level.

Thereafter, by forming the openings 13b from which the electronic circuits 2 are exposed in the protective insulating film 13 and by carrying out dice cutting, the semiconductor structure 1A shown in FIGS. 3 and 4 is completed. Here, when there is no inconvenience even when the protective insulating film 13 is on the electronic circuit 2 for operating the electronic circuit 2, there is no need to form the openings 13b in the protective insulating film 13.

The insulating layers 110, 120, 130, 140 and 150 of the semiconductor device 100A shown in FIG. 2 are formed of an insulating resin. In particular, a glass fabric board material epoxy resin, a glass fabric material polyimide resin, other glass fabric board material insulating resin composites or the like can be used for the insulating layers 110, 120, 130, 140 and 150.

In the intermediate insulating layer 110, an opening 111 which houses the semiconductor structure 1A and through holes 112 are provided. A metallic wall 162 is formed on the inner wall surface of each through hole 112.

The first lower insulating layer 120 is arranged below the semiconductor structure 1A and the intermediate insulating layer 110 and through holes 122 are provided at the positions corresponding to the through holes 112. The metallic wall 16 is formed on the inner wall surface of each of the through holes 122 continuously from the inner surface wall of corresponding through hole 112.

A wiring 164 is formed on the lower surface of the first lower insulating layer 120. Parts of the wiring 164 are formed integrally with the metallic walls 162. The wiring 164 is embedded in the second lower insulating layer 140.

The first upper insulating layer 130 is arranged on the intermediate insulating layer 110, and an opening 131 is provided at the position corresponding to the wall 23 of the semiconductor structure 1A. Further, through holes 132 are provided at the positions corresponding to the through holes 112. The metallic wall 162 is formed on the inner wall surface of each of the through holes 132 continuously from the inner wall surface of the corresponding through hole 112.

Further, in the first upper insulating layer 130, via holes 133 are provided at the positions corresponding to the external connecting electrodes 21 of the semiconductor structure 1A. The via holes 133 are filled with a filler material 163 formed of metal.

A wiring 165 is formed on the upper surface of the first upper insulating layer 130. The wiring 165 is formed integrally with the metallic walls 162 and the filler materials 163. The wiring 165 is embedded in the second upper insulating layer 150.

The second lower insulating layer 140 is arranged below the first lower insulating layer 120, and via holes 143 for exposing parts of the wiring 164 are formed in the second lower insulating layer 140. The via holes 143 are filled with a filler material 166 formed of metal.

A wiring 171 formed of metal is provided on the lower surface of the second lower insulating layer 140. Parts of the wiring 171 are formed integrally with the filler materials 166.

Further, a solder resist 181 which covers the wiring 171 is provided on the lower surface of the second lower insulating layer 140. Openings 181a for exposing parts of the wiring 171 are provided in the solder resist 181. The parts of the wiring 171 exposed from the openings 181a are the terminals 173.

The second upper insulating layer 150 is arranged above the first upper insulating layer 130, and an opening 151 is provided at the position corresponding to the opening 131. Further, via holes 153 for exposing parts of the wiring 165 are formed in the second upper insulating layer 150. A filler material 167 formed of metal is filled in the via holes 153.

On the upper surface of the second upper insulating layer 15, a wiring 172 formed of metal is provided. Parts of the wiring 172 are formed integrally with the filler materials 167.

Further, on the upper surface of the second upper insulating layer 150, a solder resist 182 which covers the wiring 172 is provided. Openings 182a for exposing parts of the wiring 172 are provided in the solder resist 182. The parts exposed from the openings 182a of the wiring 172 are terminals 174.

Next, a manufacturing method of the semiconductor device 100A will be described by using FIGS. 21 to 30.

Figure 21:
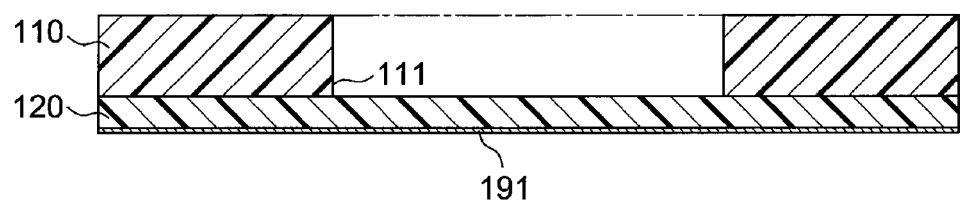
FIG. 21 is an explanatory diagram of a manufacturing method of the semiconductor device 100A.
Figure 22:
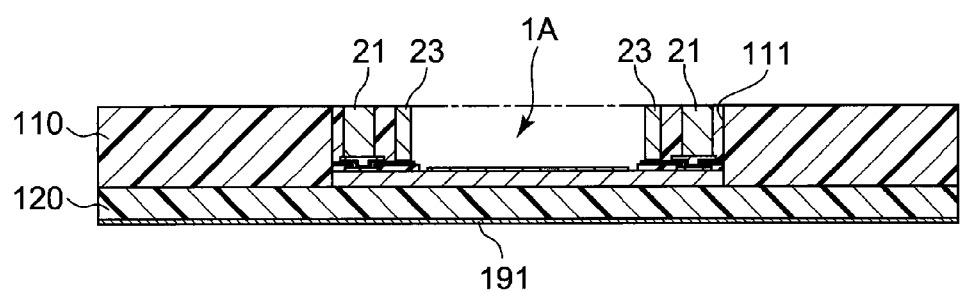
FIG. 22 is an explanatory diagram of the manufacturing method of the semiconductor device 100A.
Figure 23:
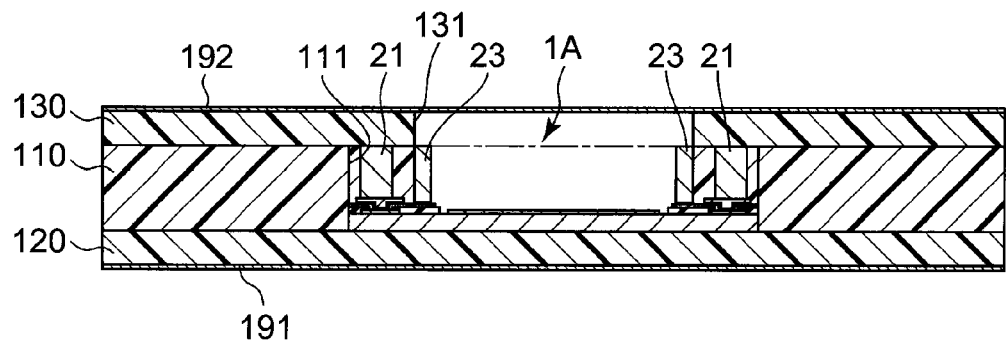
FIG. 23 is an explanatory diagram of the manufacturing method of the semiconductor device 100A.

First, as shown in FIG. 21, an intermediate insulating layer 110 which is a prepreg in which an opening 111 is formed in advance is attached on the upper surface of the first lower insulating layer 120 in which a metal foil 191 is laminated by a spattering, a deposition or the like on the lower surface thereof. Next, as shown in FIG. 22, the semiconductor structure 1A is housed in the opening 111. Thereafter, as shown in FIG. 23, the first upper insulating layer 130 in which an opening 131 is provided in advance and a metal foil 192 are layered on the intermediate insulating layer 110 and the semiconductor structure 1A. The wall 23 and the electronic circuit 2 of the semiconductor structure 1A are exposed from the opening 131. Here, the opening 111 may be formed by any one of die machining, router machining, laser machining or the like.

Figure 24:
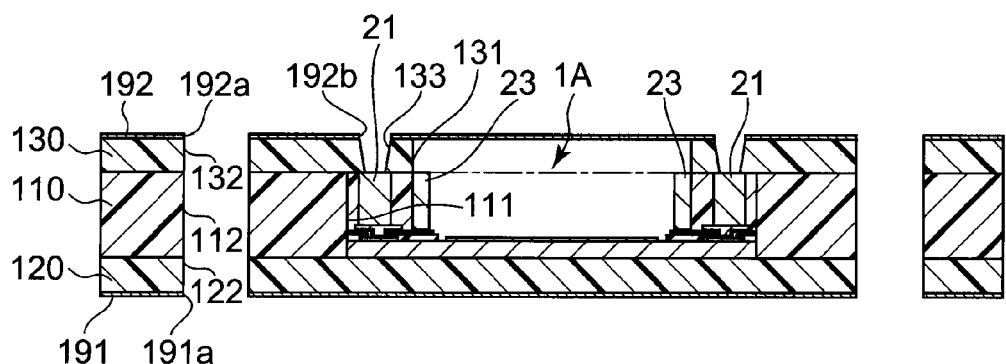
FIG. 24 is an explanatory diagram of the manufacturing method of the semiconductor device 100A.

Next, as shown in FIG. 24, openings 191a and 192a are respectively formed in the metal foils 191 and 192 at predetermined positions around the semiconductor structure 1A and through holes 112, 122 and 132 are respectively formed in the insulating layers 110, 120 and 130 at the positions corresponding to the openings 191a and 192a by laser drilling machining. Further, an opening 192b and a via hole 133 are formed in the metal foil 192 and the first upper insulating layer 130 at each of the positions directly above the external connection electrodes 21 by laser drilling machining.

Figure 25:
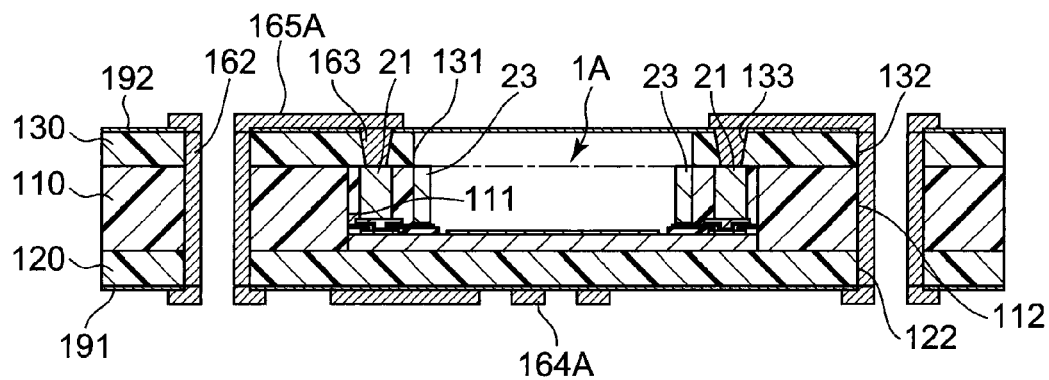
FIG. 25 is an explanatory diagram of the manufacturing method of the semiconductor device 100A.

Thereafter, as shown in FIG. 25, a metallic wall 162 is formed on the inner wall of each of the through holes 112, 122 and 132 of the insulating layers 110, 120 and 130, respectively, by carrying out an electroless-plating process and an electroplating process in order. Furthermore, the filler material 163 is filled in the via holes 133 and a wiring 164A and a wiring 165A are formed on the surface of the metal foil 191 and the surface of the metal foil 192, respectively.

Figure 26:
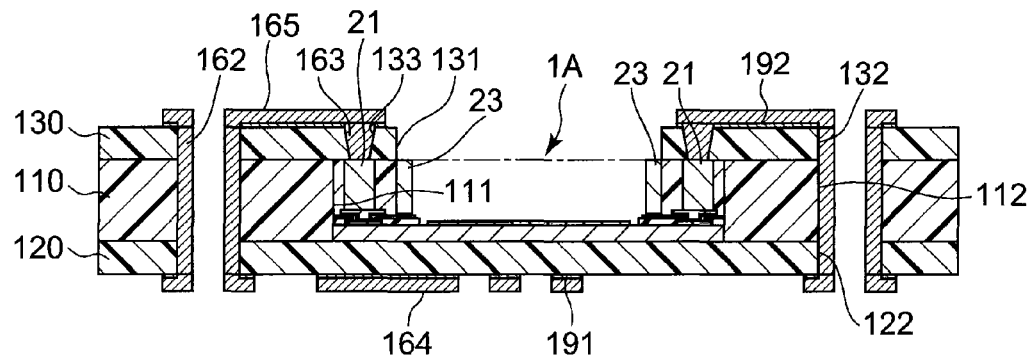
FIG. 26 is an explanatory diagram of the manufacturing method of the semiconductor device 100A.

Next, as shown in FIG. 26, by removing the metal foils 191 and 192 from the parts where the wirings 164A and 165A are not formed by carrying out soft etching, the wiring 164 constituted of the metal foil 191 and the wiring layer 164A and the wiring 165 constituted of the metal foil 192 and the wiring layer 165A are formed.

Figure 27:
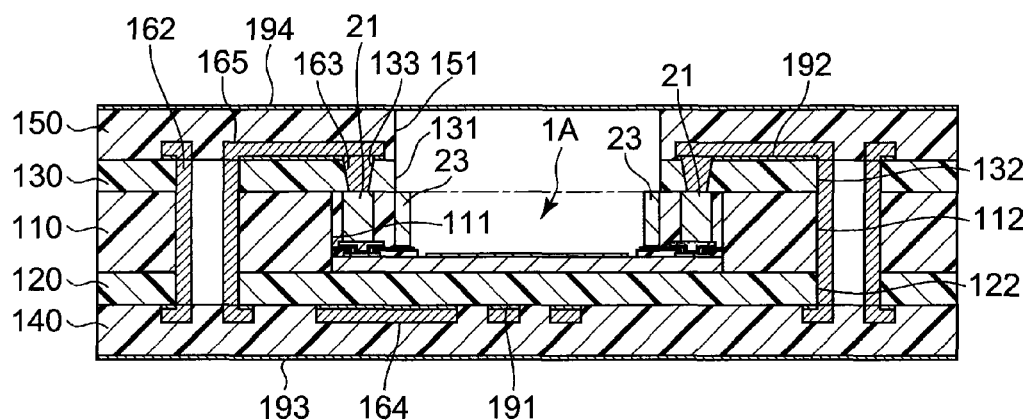
FIG. 27 is an explanatory diagram of the manufacturing method of the semiconductor device 100A.

Subsequently, as shown in FIG. 27, the second lower insulating layer 140 is layered below the first lower insulating layer 120 and a metal foil 193 is layered below the second lower insulating layer 140 in order. Further, the second upper insulating layer 150 in which an opening 151 is provided in advance is layered above the first upper insulating layer 130 and a metal foil 194 is layered above the second upper insulating layer 150 in order.

Figure 28:
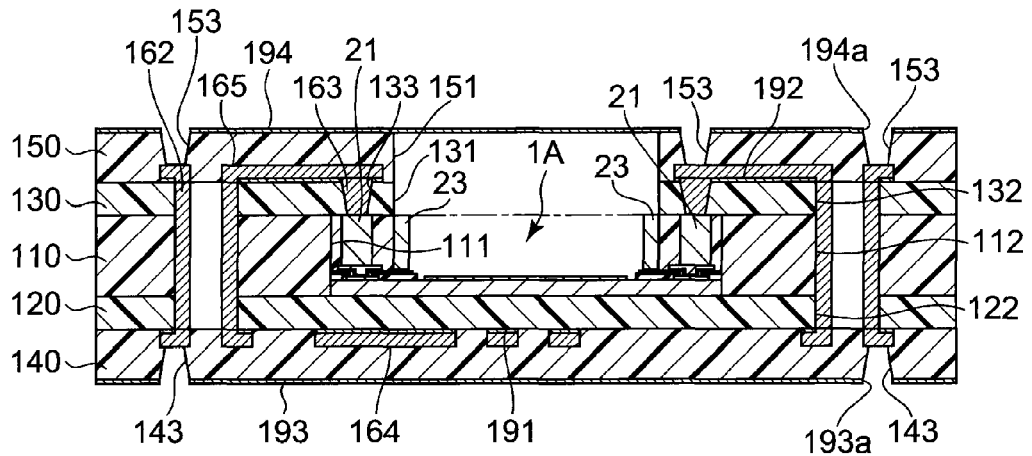
FIG. 28 is an explanatory diagram of the manufacturing method of the semiconductor device 100A.

Next, as shown in FIG. 28, via holes 143 and via holes 153 are formed at the same time as when openings 193a and openings 194a are formed in the metal foils 193 and 194 at the positions corresponding to the via holes 143 and the via holes 153, respectively, to expose parts of the wiring 164 and the wiring 165.

Figure 29:
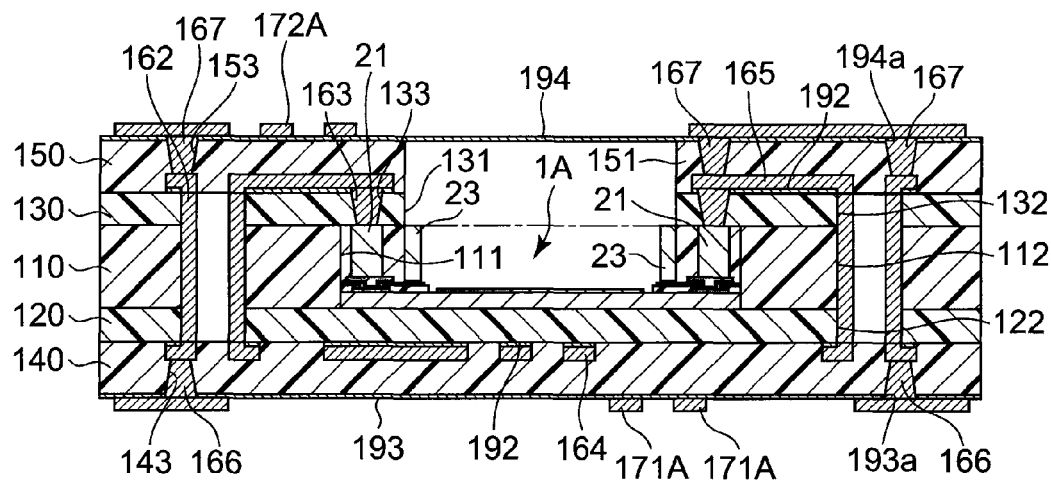
FIG. 29 is an explanatory diagram of the manufacturing method of the semiconductor device 100A.

Thereafter, as shown in FIG. 29, by forming a resist pattern in a predetermined region and by carrying out an electroless-plating process and an electroplating process in order, a filler material 166 and a filled material 167 are respectively filled in the via holes 143 and the via holes 153 which are regions where the resist pattern is not formed, and a metal layer 171A which becomes a wiring 171 and a metal layer 172A which becomes a wiring 172 are respectively formed in the regions on the surface of the metal foil 193 and the surface of the metal foil 194 where the resist pattern is not formed.

Figure 30:
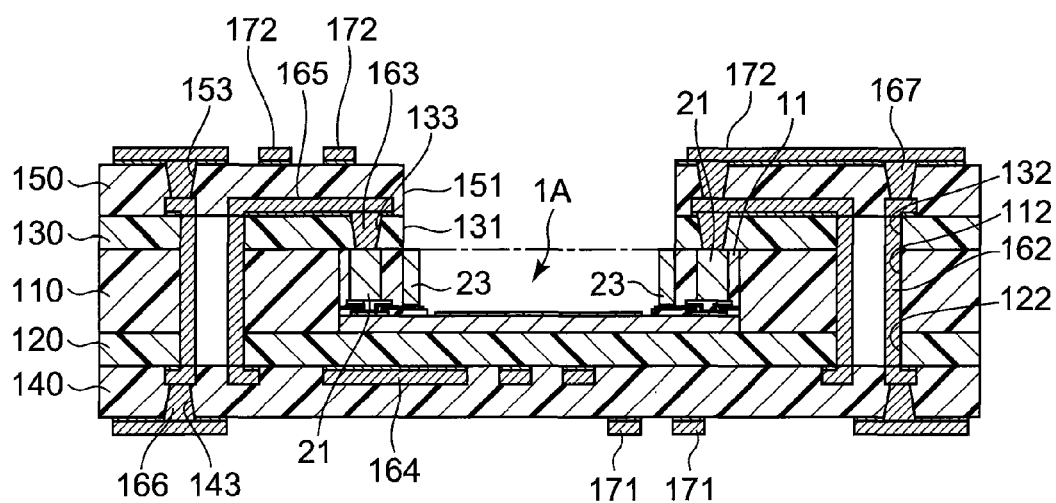
FIG. 30 is an explanatory diagram of the manufacturing method of the semiconductor device 100A.

Next, as shown in FIG. 30, the wiring 171 which is constituted of the metal foil 193 and the wiring layer 171A and the wiring 172 which is constituted of the metal foil 194 and the wiring layer 172A are formed by removing the metal foils 193 and 194 in the regions where the resist pattern is not formed, that is, in the regions where the wiring layer 171A and the wiring layer 172A are not formed, by carrying out soft etching after removing the resist pattern.

Thereafter, a solder resist 181 which covers the lower surface of the second lower insulating layer 140 and the wiring 171 is provided and openings 181a are provided by patterning the solder resist 181 to expose the terminals 173 of the wiring 171. In similar manner, a solder resist 182 which covers the upper surface of the second upper insulating layer 150 and the wiring 172 is provided and openings 182a are provided by patterning the solder resist 182 to expose the terminals 174 of the wiring 172. With that, the semiconductor device 100A shown in FIGS. 1 and 2 is completed.

In such way, according to the embodiment, the semiconductor structure 1A in which the sealing resin 22 is filled in a region (wiring region) of the semiconductor substrate 10 outside of the wall 23, the wall 23 encircling a region of the semiconductor substrate 10 in which the electronic circuit 2 is formed, is used. Therefore, the semiconductor structure 1A can be packaged in the semiconductor device 100A in a state where the region in which the electronic circuit 2 is formed is exposed. Thus, the present invention can be applied to the packaging of a mechanical device and an optical device.

Second Embodiment

Figure 31:
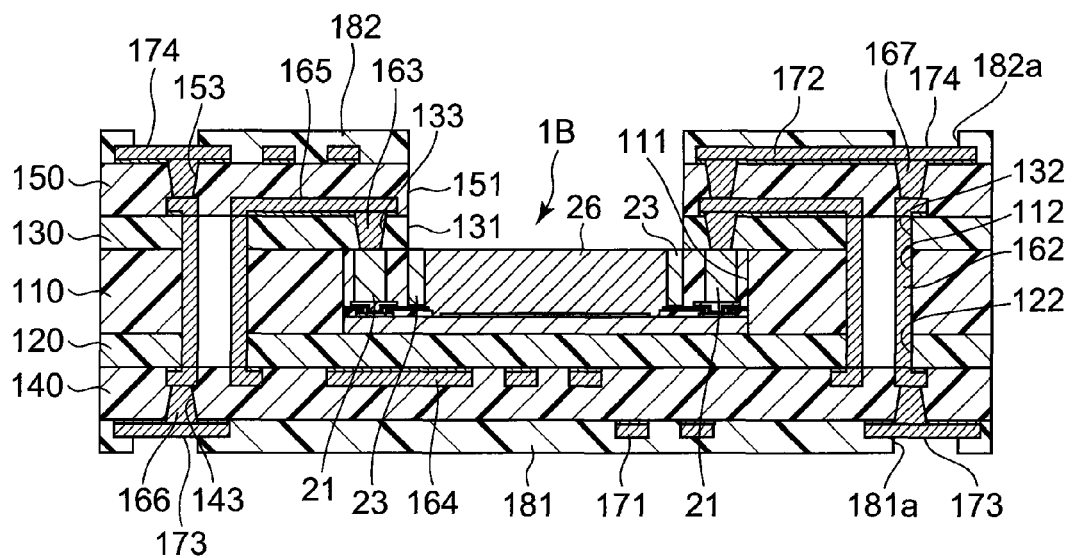
FIG. 31 is a cross-sectional view, similar to FIG. 2, showing a semiconductor device 100B according to the second embodiment of the present invention.

FIG. 31 is a cross-sectional view, similar to FIG. 2, showing the semiconductor device 100B according to the second embodiment of the present invention. Here, with respect to the structures similar to that of the semiconductor device 100A according to the first embodiment, same symbols are used and the descriptions are omitted.

The semiconductor device 100B is a semiconductor device in which the semiconductor structure 1B is packaged instead of the semiconductor structure 1A.

Figure 32:
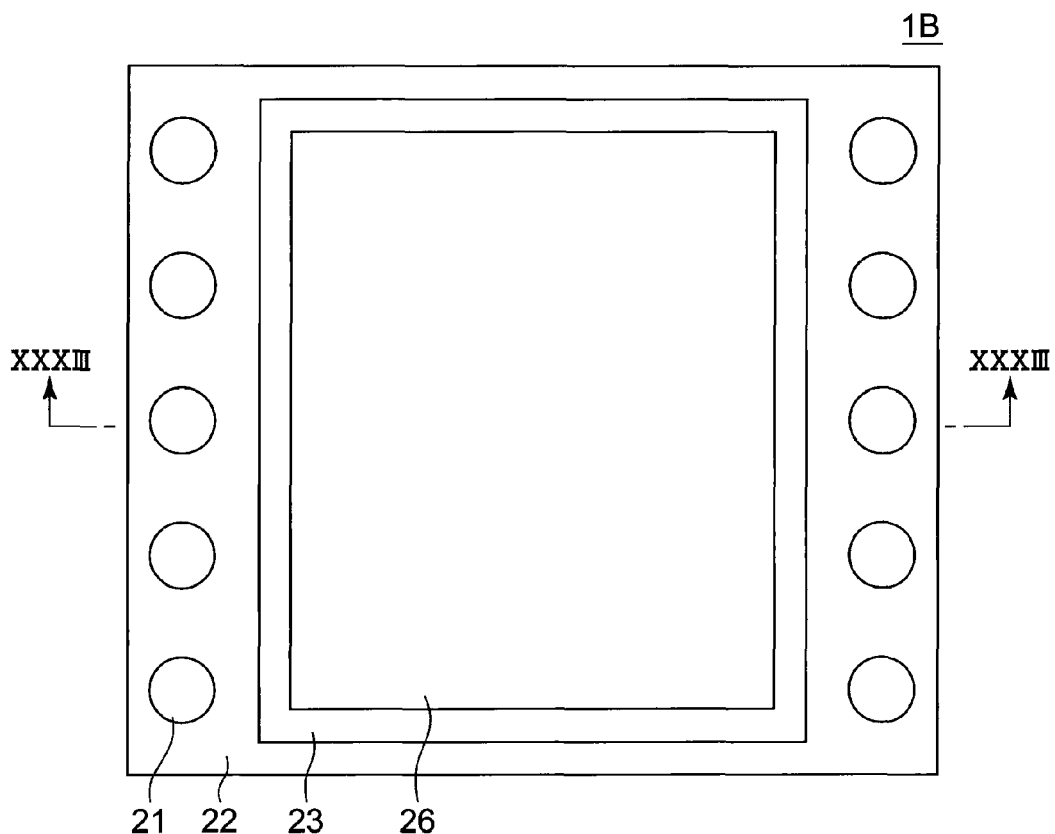
FIG. 32 is a plan view showing a semiconductor structure 1B.
Figure 33:
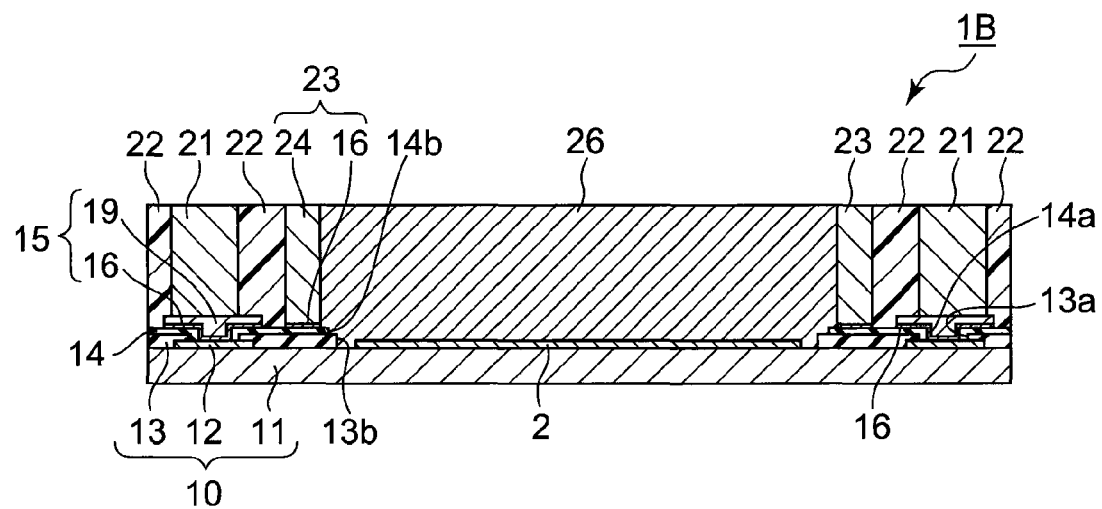
FIG. 33 is a cross-sectional view when cult along the line XXXIII-XXXIII in FIG. 32.

Here, the semiconductor structure 1B will be described. FIG. 32 is a plan view showing the semiconductor structure 1B and FIG. 33 is a cross-sectional view when cut along the line XXXIII-XXXIII in FIG. 32. As for the structures similar to that of the semiconductor structure 1A of the first embodiment, the descriptions will be omitted.

As shown in FIGS. 32 and 33, in an upper surface-side of a silicon substrate 11, an electronic circuit 2, connection pads 12 and wirings for connecting the electronic circuit 2 and the connection pads 12, and the like are formed. The electronic circuit 2 is an optical device which does not have a movable part and is a photosensor, an infrared imager or the like, for example.

In a region (device region) on the upper surface of the silicon substrate 11 and inside of the wall 23, a transparent resin 26 which seals the electronic circuit 2 is filled. As for the transparent resin 26, a heat-curable resin such as heat-curable polyimide, epoxy resin, phenol resin or the like can be used.

Figure 34:
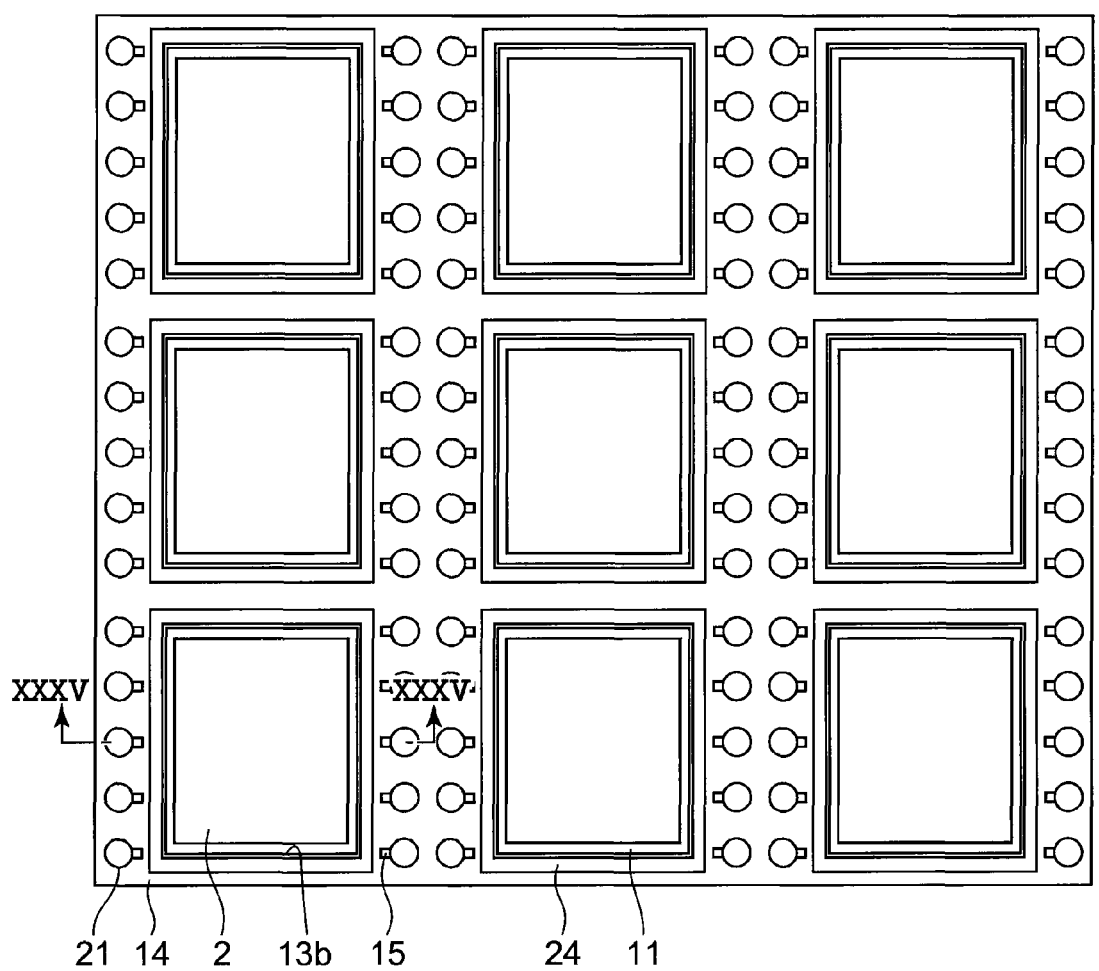
FIG. 34 is a plan view showing a silicon substrate in the middle of manufacturing the semiconductor structure 1B before dice cutting is carried out.
Figure 36:
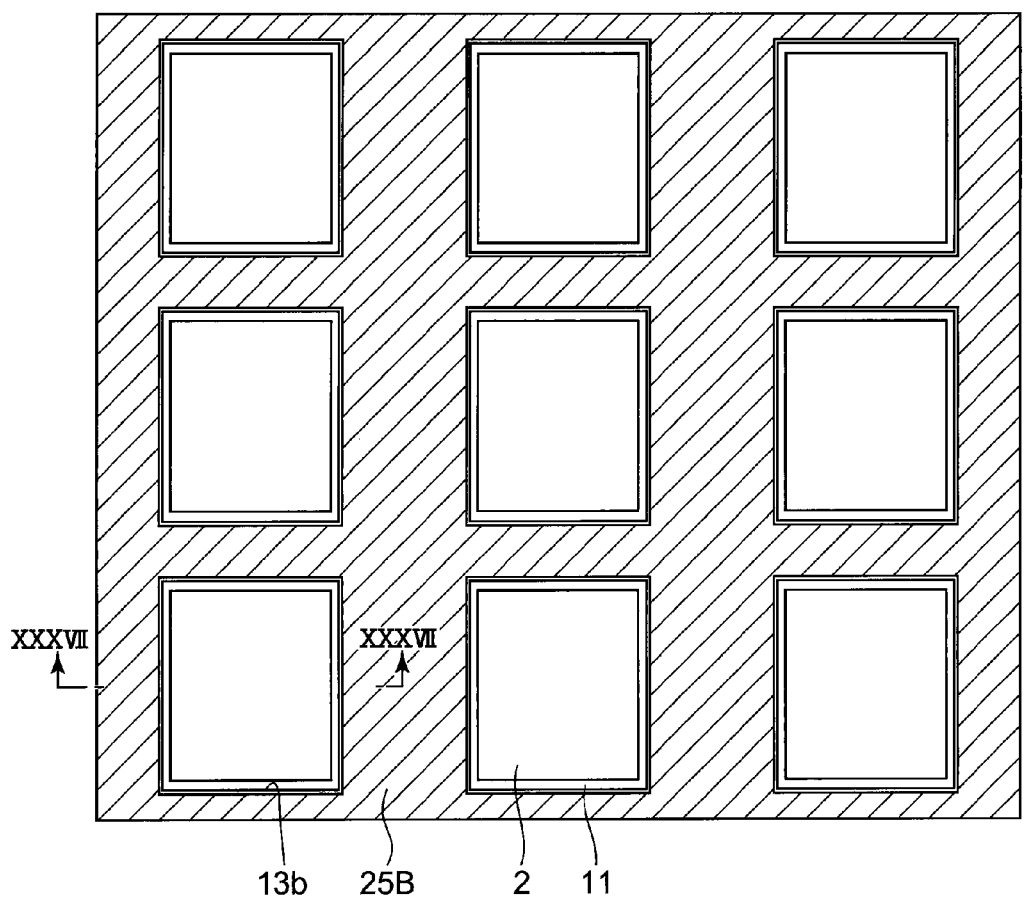
FIG. 36 is a plan view showing the silicon substrate in the middle of manufacturing the semiconductor structure 1B before dice cutting is carried out.
Figure 37:
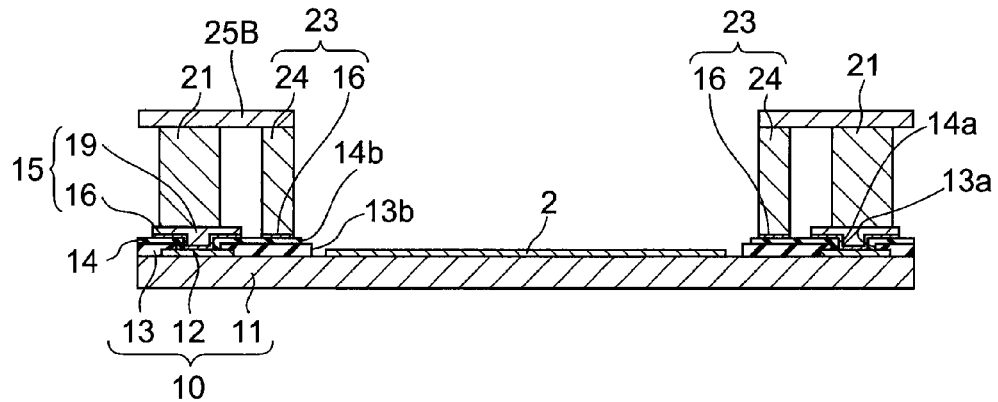
FIG. 37 is a cross-sectional view when cut along the line XXXVII-XXXVII in FIG. 36.
Figure 38:
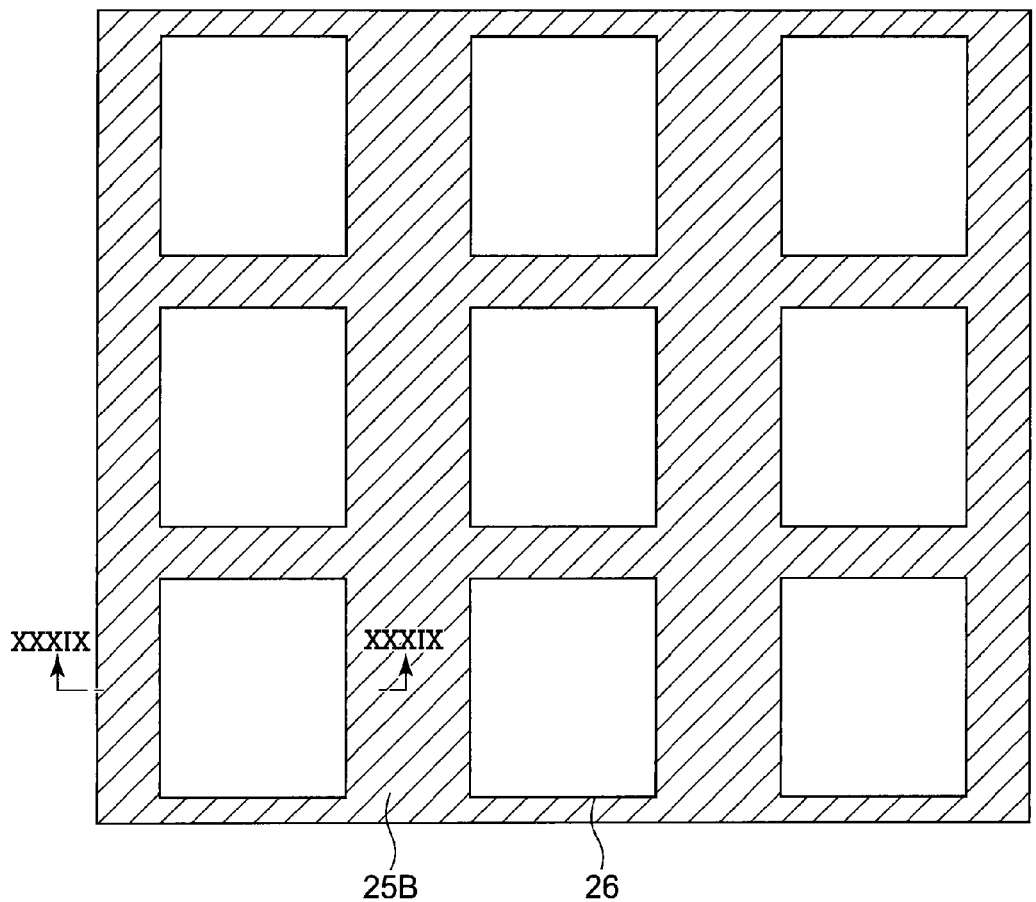
FIG. 38 is a plan view showing the silicon substrate in the middle of manufacturing the semiconductor structure 1B before dice cutting is carried out.
Figure 39:
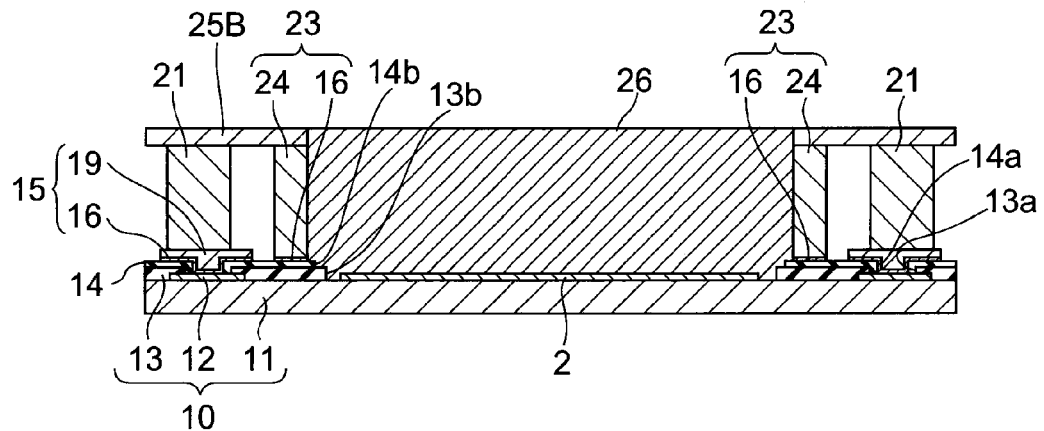
FIG. 39 is a cross-sectional view when cut along the line XXXIX-XXXIX in FIG. 38.
Figure 40:
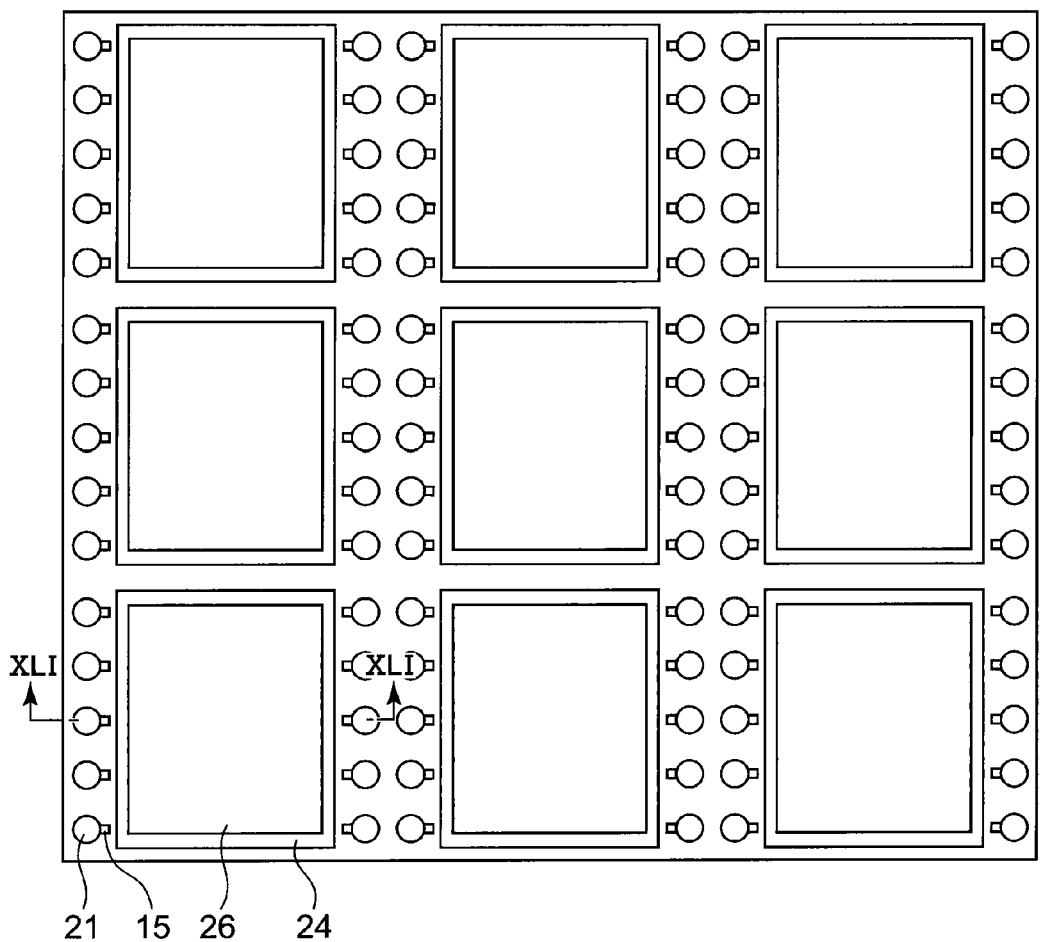
FIG. 40 is a plan view showing the silicon substrate in the middle of manufacturing the semiconductor structure 1B before dice cutting is carried out.
Figure 41:
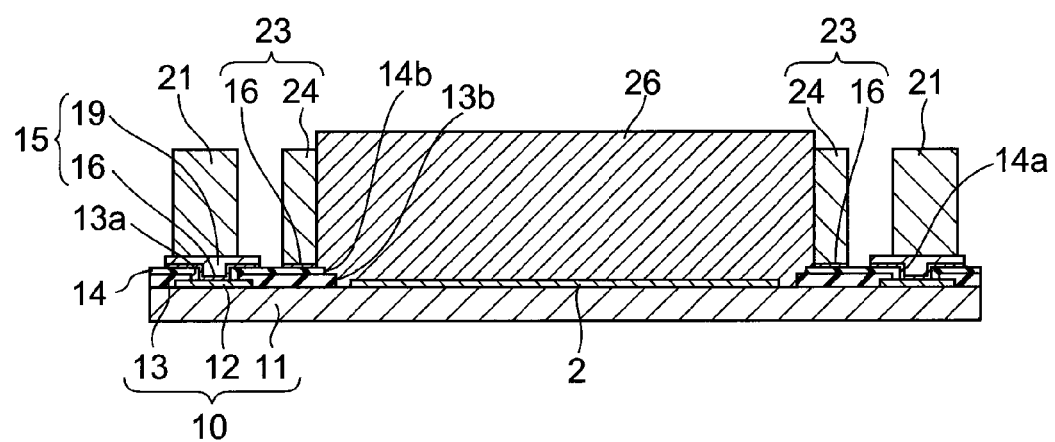
FIG. 41 is a cross-sectional view when cut along the line XLI-XLI in FIG. 40.

Next, a manufacturing method of the semiconductor structure 1B will be described by using FIGS. 34 to 43. Here, FIGS. 34, 36, 38 and 40 are plan views showing the silicon substrate in the middle of manufacturing the semiconductor structure 1B before dice cutting is carried out. Further, FIG. 35 is a cross-sectional view when cut along the line XXXV-XXXV in FIG. 34, FIG. 37 is a cross-sectional view when cut along the line XXXVII-XXXVII in FIG. 36, FIG. 39 is a cross-sectional view when cut along the line XXXIX-XXXIX in FIG. 38, FIG. 41 is a cross-sectional view when cut along the line XLI-XLI in FIG. 40 and FIG. 43 is a cross-sectional view when cut along the line XLIII-XLIII in FIG. 42.

First, similarly to the semiconductor structure 1A of the first embodiment, the procedures from the forming of the insulating film 14 up to the removing of the resist 20 shown in FIGS. 5 to 12 are carried out.

Figure 35:
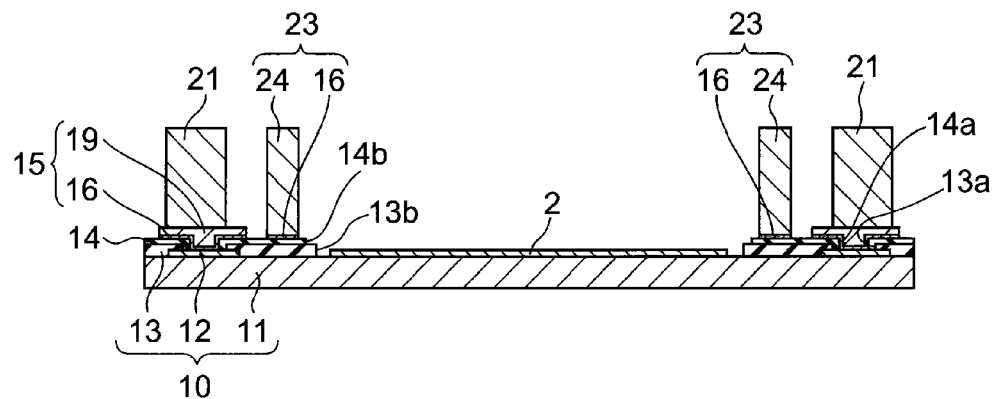
FIG. 35 is a cross-sectional view when cut along the line XXXV-XXXV in FIG. 34.

Next, as shown in FIGS. 34 and 35, the electroplating seed layer 16 in regions where the wiring layer 19, the external connection electrodes 21 and the wall layer 24 are not formed is removed by carrying out soft etching to form the wirings 15 and the walls 23. Thereafter, openings 13b for exposing the electronic circuits 2 are formed in the protective insulating film 13 by carrying out photolithography.

Here, the surfaces of the wiring layer 19, external connection electrode 21 and wall layer 24 are also etched when carrying out soft etching. However, because the wiring layer 19, the external connection electrodes 21 and the wall layer 24 are considerably thicker comparing to the electroplating seed layer 16, there is no affect.

Next, a visual inspection is carried out to confirm whether there are breaks in the wirings 15 or not and whether there are foreign substances on the semiconductor substrate 10 or not. Then, by carrying out the oxygen plasma treatment to the surface of the insulating film 14, foreign substances such as carbides and the like on the surface are removed.

Thereafter, as shown in FIGS. 36 and 37, a lid 25B which covers the region (the wiring region) outside of the walls 23 is placed on the walls 23. As for the lid 25B, a print mask plate formed of copper, stainless or the like can be used, for example.

Next, as shown in FIGS. 38 and 39, a transparent resin 26 is filled in the region (the device region) inside of each wall 23. At this time, because the region (the wiring region) outside of the walls 23 is covered with the lid 25B, the wiring region will not be filled with the transparent resin 26.

Next, as shown in FIGS. 40 and 41, the lid 25B is removed after the transparent resin 26 is cured.

Figure 42:
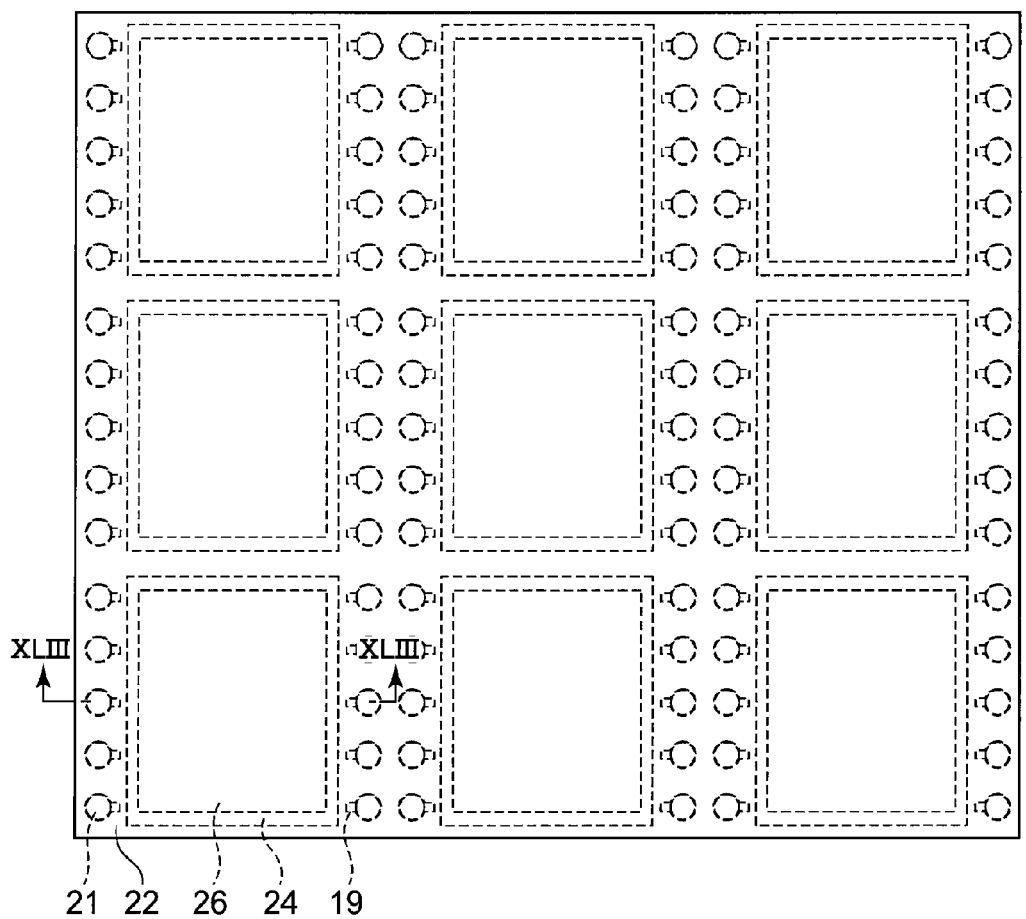
FIG. 42 is a plan view showing the silicon substrate in the middle of manufacturing the semiconductor structure 1B before dice cutting is carried out.
Figure 43:
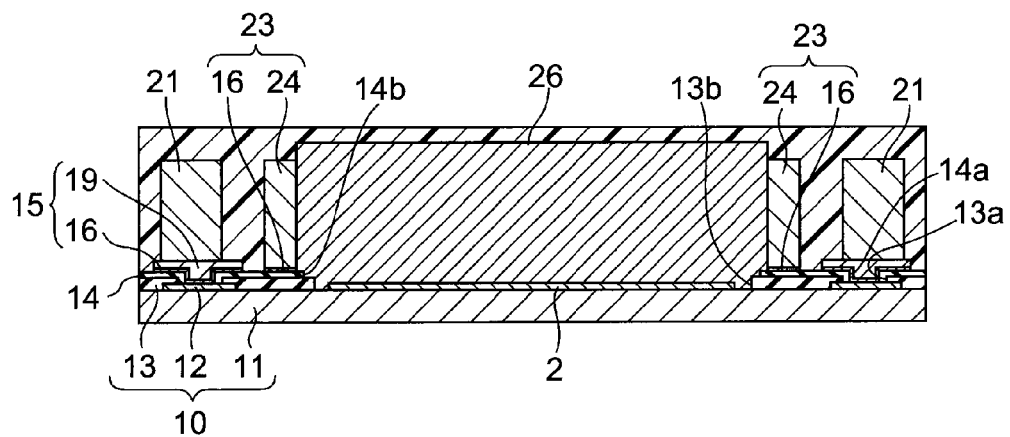
FIG. 43 is a cross-sectional view when cut along the line XLIII-XLIII in FIG. 42.

Subsequently, as shown in FIGS. 42 and 43, the sealing resin 22 is applied on the entire surface of the silicon substrate 11. The sealing resin 22 may have a permeability lower than the transparent resin 26. The sealing resin 22 is formed of a composite (composite material) of a heat-curable resin such as a heat-curable polyimide, an epoxy resin, a phenol resin or the like and a filler such as silica. However, a heat-curable resin not containing a filler may also be used.

Next, by trimming the sealing resin 22 from the upper surface, the external connection electrodes 21, the sealing resin 22, the walls 23 and the transparent resin 26 are formed so that the surfaces thereof are at the same surface level with each other. Thereafter, by carrying out dice cutting to the silicon substrate 11, the semiconductor structure 1B shown in FIGS. 32 and 33 is completed.

By using the completed semiconductor structure 1B, the procedures shown in FIGS. 21 to 30 are carried out similarly as in the procedures for the semiconductor device 100A of the first embodiment. With that, the semiconductor device 100B is completed.

According to the embodiment, the semiconductor structure 1B in which the region (the device region) of the semiconductor substrate 10 inside of the wall 23, the wall 23 encircling the device region in which the electronic circuit 2 is formed, is sealed by the transparent resin 26 is used. Therefore, the semiconductor structure 1B can be packaged in the semiconductor device 100B in a state where the device region in which the electronic circuit 2 is formed can be seen from outside. Thus, the present invention can be applied to the packaging of an optical device.

Third Embodiment

Figure 44:
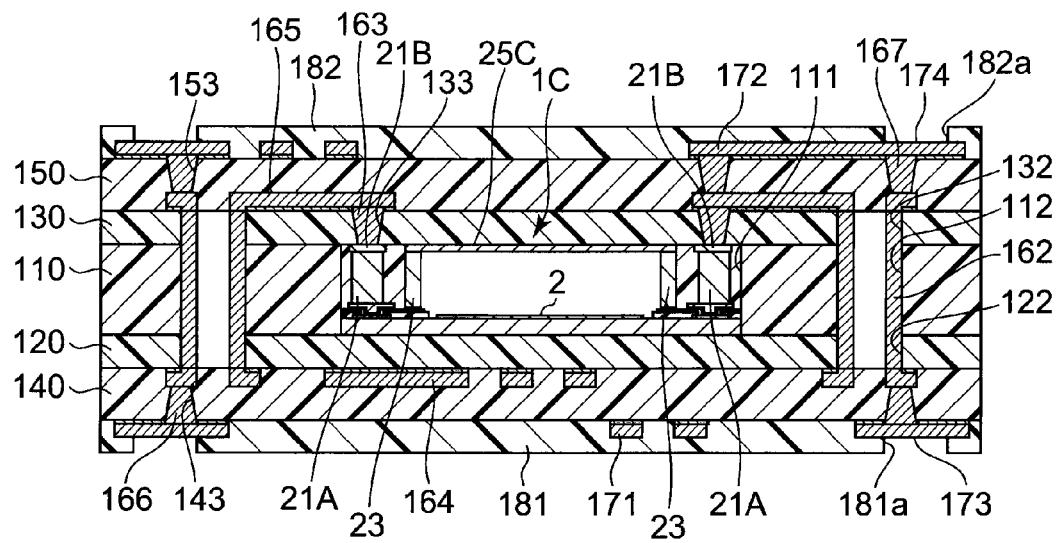
FIG. 44 is a cross-sectional view, similar to FIG. 2, showing a semiconductor device 100C according to the third embodiment of the present invention.

FIG. 44 is a cross-sectional view, similar to FIG. 2, showing the semiconductor device 100C according to the third embodiment of the present invention. Here, as for the structures similar to that of the semiconductor device 100A according to the first embodiment, same symbols are used and the descriptions are omitted.

The semiconductor device 100C is a semiconductor device in which the semiconductor structure 1C is packaged instead of the semiconductor structure 1A.

This embodiment differs from the first and the second embodiments in that the openings 131 and 151 are not provided in the insulating layers 130 and 150.

Figure 45:
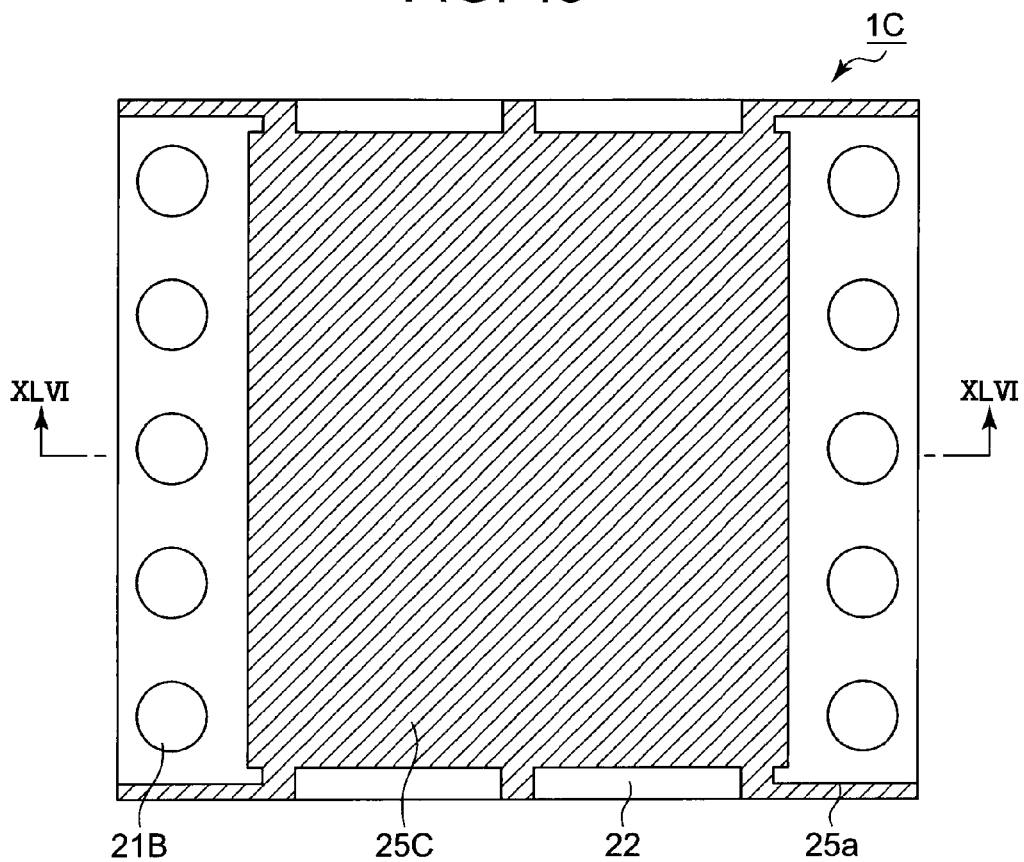
FIG. 45 is a plan view showing a semiconductor structure 1C.
Figure 46:
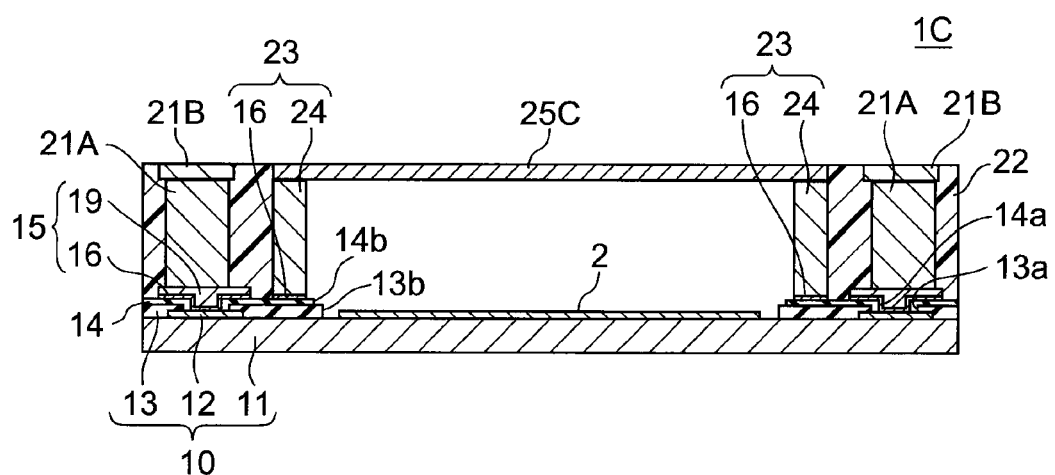
FIG. 46 is a cross-sectional view when cut along the line XLVI-XLVI in FIG. 45.

Here, the semiconductor structure 1C will be described. FIG. 45 is a plan view showing the semiconductor structure 1C and FIG. 46 is a cross-sectional view when cut along the line XLVI-XLVI in FIG. 45. As for the structures similar to that of the semiconductor structure 1A of the first embodiment, the descriptions will be omitted.

As shown in FIGS. 45 and 46, in an upper surface-side of a silicon substrate 11, an electronic circuit 2, connection pads 12, wirings which connect the electronic circuit 2 and the connection pads 12, and the like are formed. For example, the electronic circuit 2 is an acceleration sensor, a pressure sensor, a micro gyro, a flow sensor, a gas sensor, an infrared imager, a microactuator, an ink-jet printer head, a resonator filter, a miniature relay, a micro-prober, a scanning probe microscope, an optical switch, a digital mirror device, an optical scanner or the like.

In the semiconductor structure 1C, with respect to each of the wirings 15, a land is formed at the end part of the wiring 15 on the opposite side of the connection pad 12 and an external connection electrode 21A is formed on the land, and further, an external connection electrode 21B formed of a conductive material such as copper or the like is formed on the external connection electrode 21A. Here, from a view point of connectivity, it is preferred that the diameter of the external connection electrode 21B is larger than that of the external connection electrode 21A. However, the diameters of the external connection electrode 21B and the external connection electrode 21A may be equal to each other or the diameter of the external connection electrode 21B may be smaller than that of the external connection electrode 21A.

The height level of the external connection electrodes 21A is about 45 to 85 μm, and the height level is about 50 to 100 μm when combined with the thickness of the wirings 15. The external connection electrodes 21A and the wall 23 are formed so that the surfaces thereof are at the same surface level with each other.

A lid 25C which covers the region (the device region in which the electronic circuit 2 is arranged) inside of the wall 23 is provided on the wall 23. The surface level of the lid 25C is equal to the surface level of the external connection electrodes 21B. As for the lid 25C, a print mask plate formed of copper, stainless or the like can be used, for example. Alternatively, a transparent material such as polycarbonate or the like can be used, for example, in order to apply an optical device as the electronic circuit 2.

Here, the lid 25C has a connection unit 25a at the part outside of the wall 23 for connecting with other lids 25C so that the lids 25C of the semiconductor structures 1C adjacent to each other can be handled as one before dice cutting is carried out to the silicon substrate 11. The connection units 25a may be removed in the manufacturing process.

Figure 52:
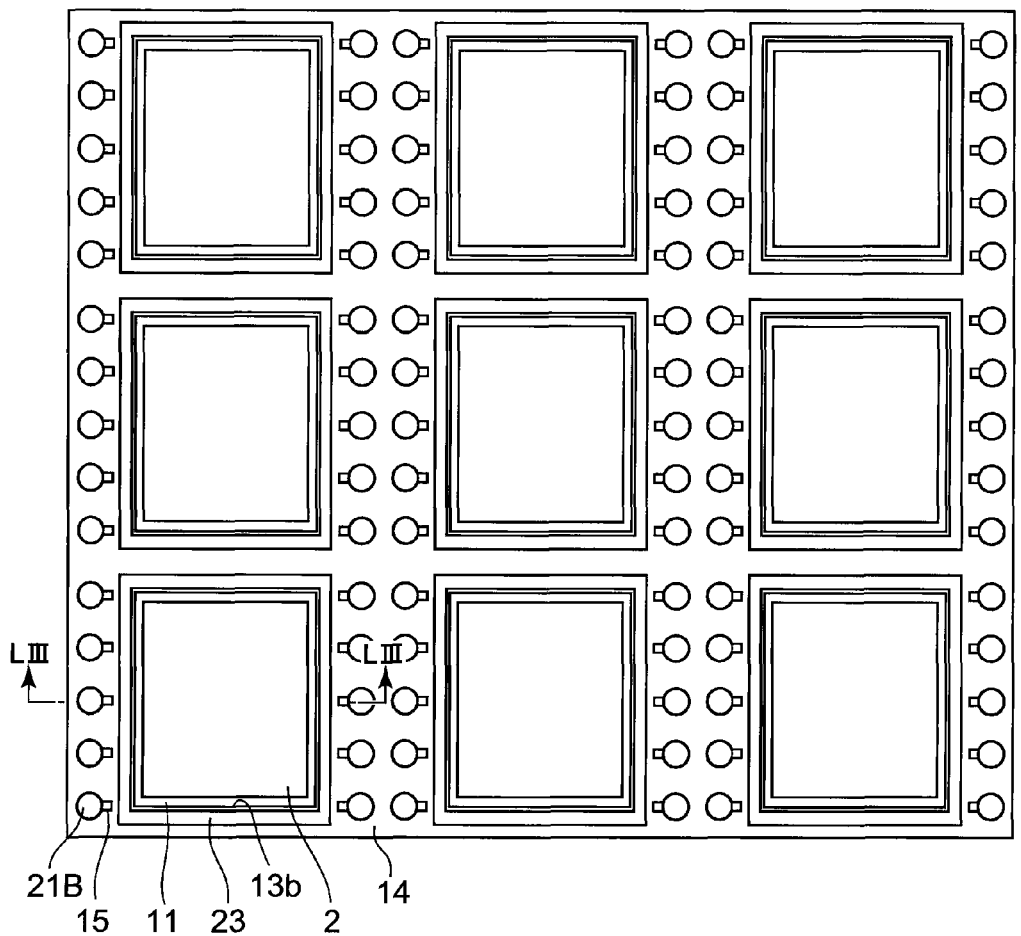
FIG. 52 is a plan view showing a silicon substrate in the middle of manufacturing the semiconductor structure 1C before dice cutting is carried out.
Figure 53:
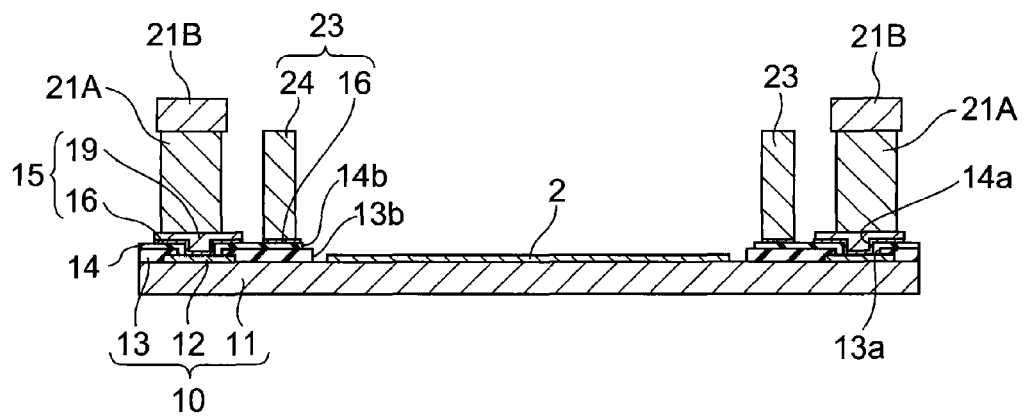
FIG. 53 is a cross-sectional view when cut along the line LIII-LIII in FIG. 52.
Figure 54:
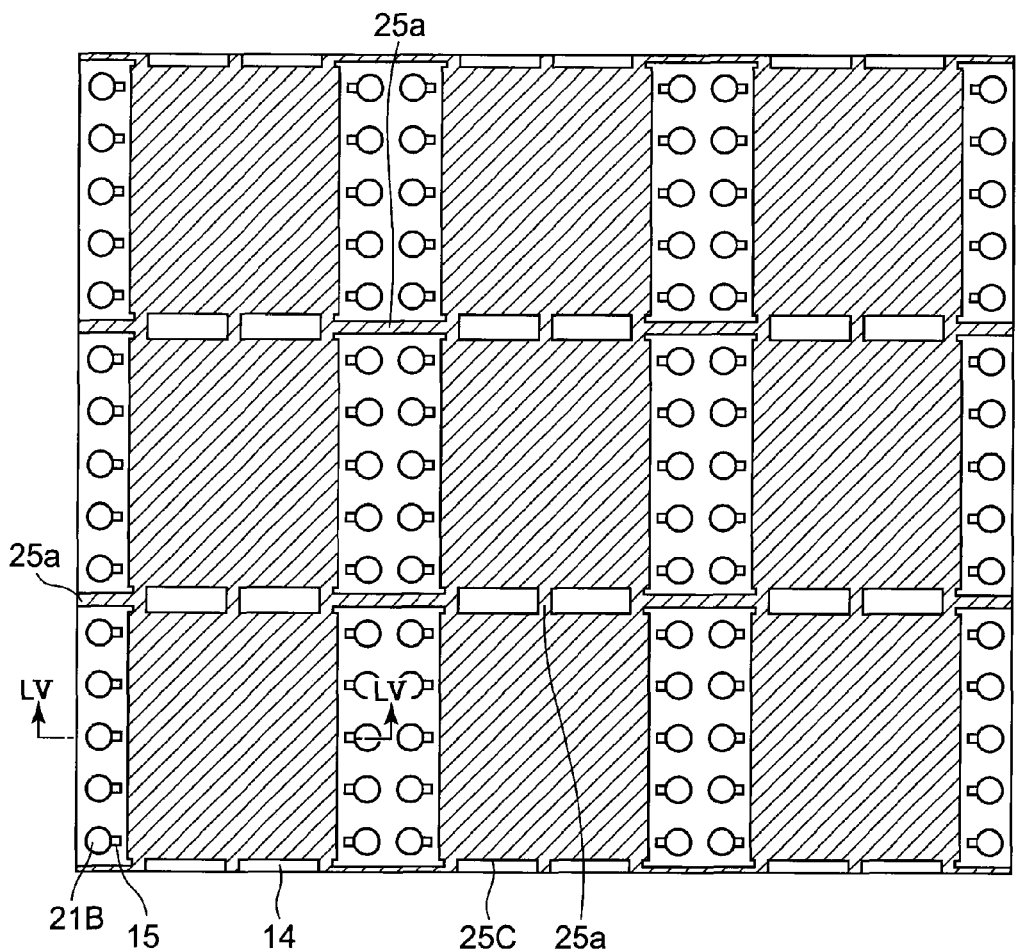
FIG. 54 is a plan view showing the silicon substrate in the middle of manufacturing the semiconductor structure 1C before dice cutting is carried out.
Figure 55:
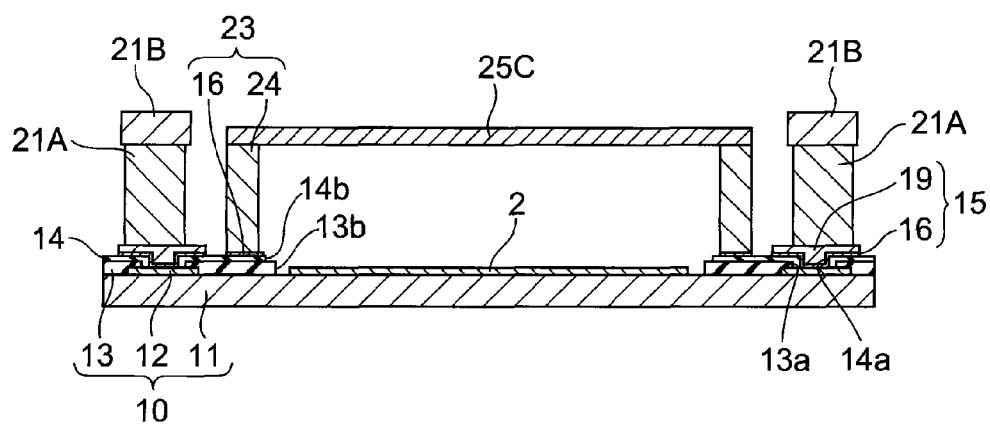
FIG. 55 is a cross-sectional view when cut along the line LV-LV in FIG. 54.
Figure 56:
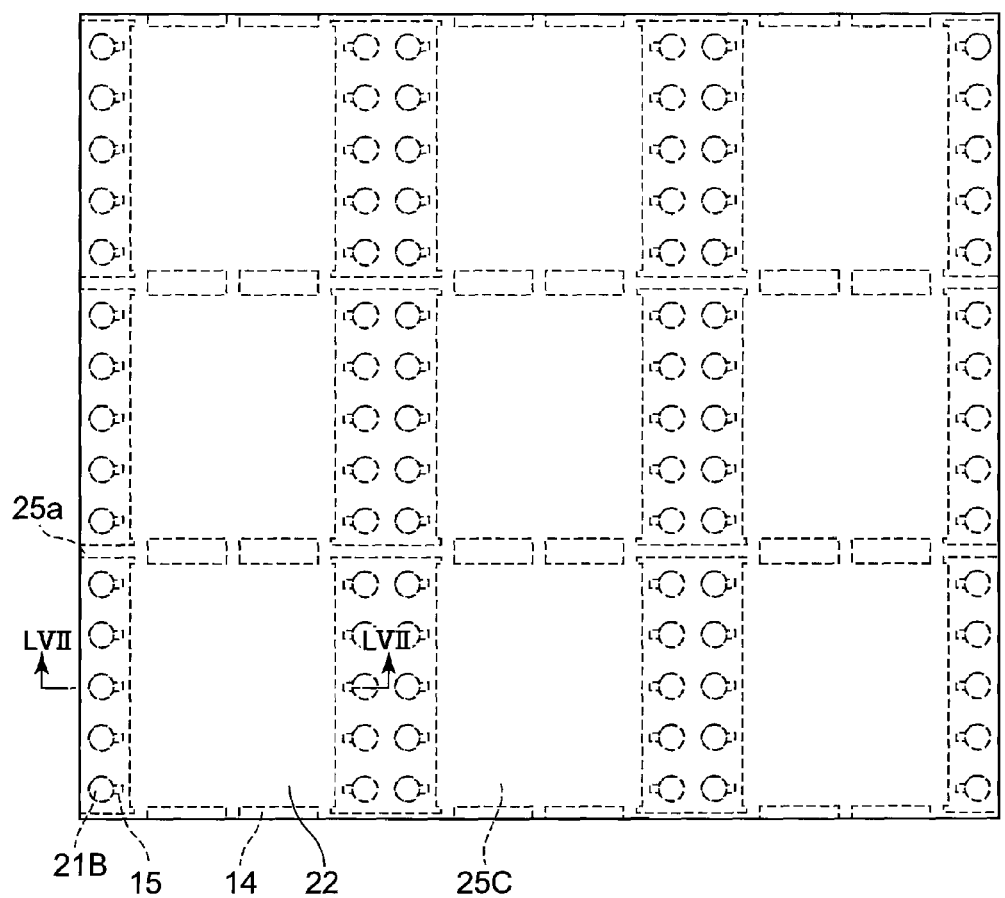
FIG. 56 is a plan view showing the silicon substrate in the middle of manufacturing the semiconductor structure 1C before dice cutting is carried out.
Figure 57:
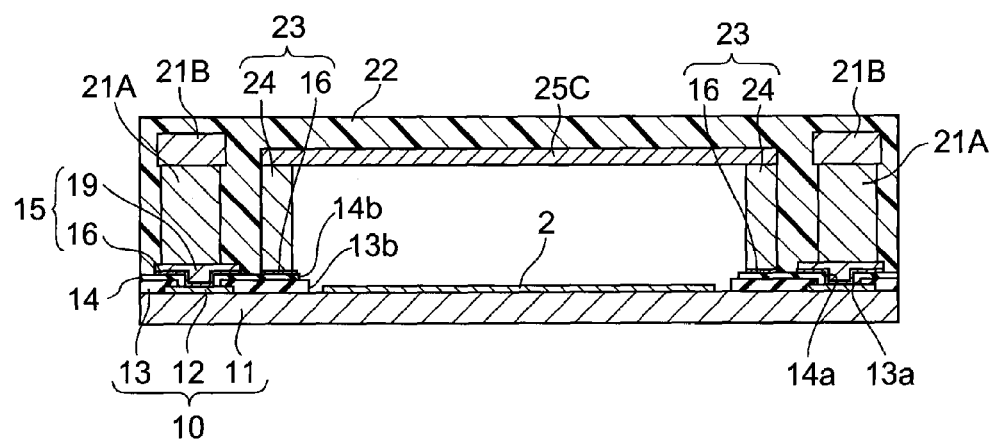
FIG. 57 is a cross-sectional view when cut along the line LVII-LVII in FIG. 56.

Next, a manufacturing method of the semiconductor structure 1C will be described by using FIGS. 47 to 57. Here, FIGS. 47 to 50 are cross-sectional views of the silicon substrate in the middle of manufacturing before dice cutting is carried out. Further, FIGS. 52, 54 and 56 are plan views showing the silicon substrate in the middle of manufacturing the semiconductor structures 1C before dice cutting is carried out, FIG. 53 is a cross-sectional view when cut along the line LIII-LIII in FIG. 52, FIG. 55 is a cross-sectional view when cut along the line LV-LV in FIG. 54 and FIG. 57 is a cross-sectional view when cut along the line LVII-LVII in FIG. 56.

First, similarly to the semiconductor structure 1A of the first embodiment, the procedures from forming of the insulating film 14 to removing of the wiring resist 17 shown in FIGS. 5 to 9 are carried out.

Figure 47:
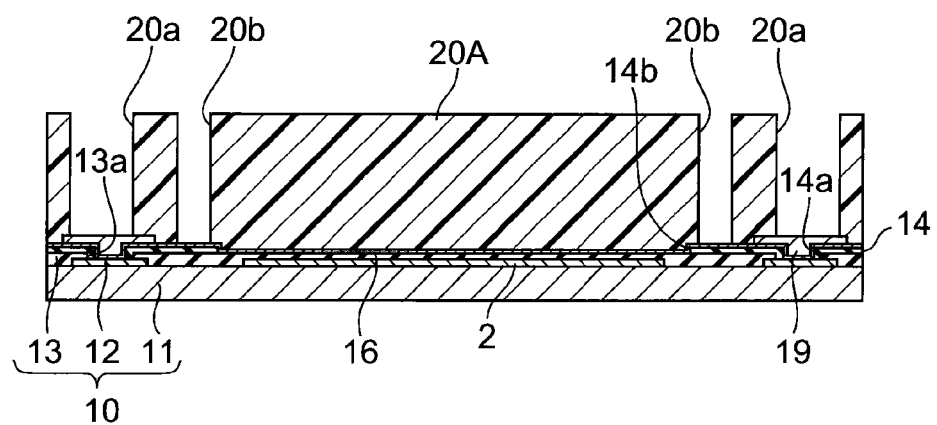
FIG. 47 is an explanatory diagram of a manufacturing method of the semiconductor structure 1C.

Next, as shown in FIG. 47, a resist 20A for the external connection electrodes 21A and the wall layer 24 is formed by attaching a dry film on the upper surfaces of the electroplating seed layer 16 and the wiring layer 19 and by patterning the dry film. Here, in the resist 20A, openings 20a are provided at the parts where the external connection electrodes 21A are to be formed and openings 20b are provided at the parts where the wall layer 24 is to be formed.

Figure 48:
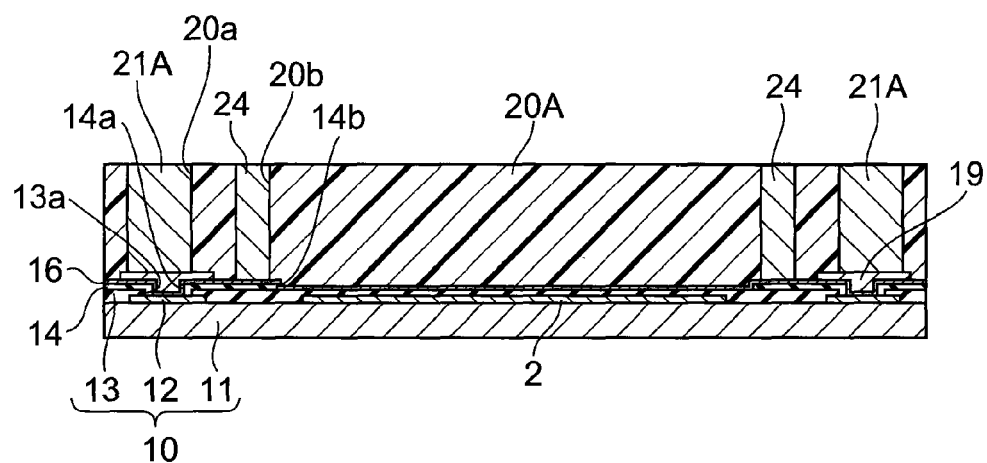
FIG. 48 is an explanatory diagram of the manufacturing method of the semiconductor structure 1C.

Next, as shown in FIG. 48, by carrying out electroplating by setting the electroplating seed layer 16 as a negative electrode, the external connection electrodes 21A are formed by being deposited in the openings 20a of the resist 20A and the wall layer 24 is formed by being deposited in the openings 20b. It is preferred that the surfaces of the external connection electrodes 21A and the wall layer 24 are trimmed as needed so that the upper surfaces of the external connection electrode 21A and the wall layer 24 be at the same surface level with the resist 20A and the entire surface will be flat and smooth.

Figure 49:
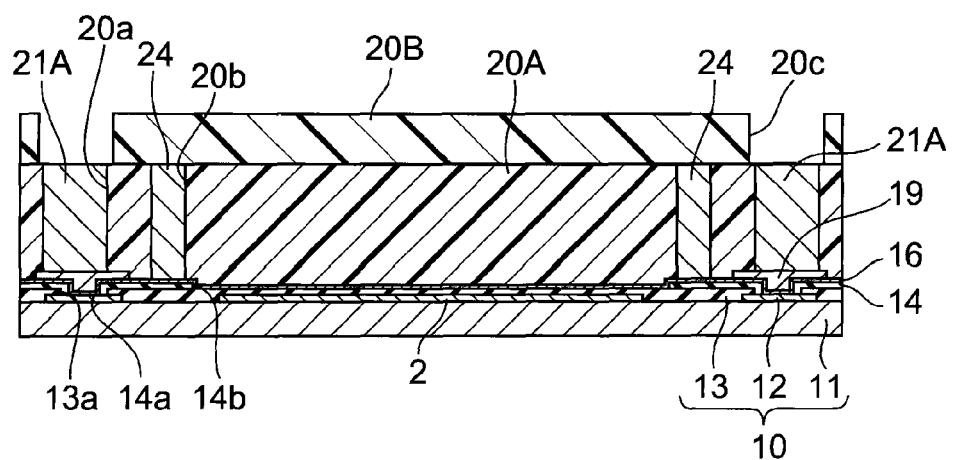
FIG. 49 is an explanatory diagram of the manufacturing method of the semiconductor structure 1C.

Thereafter, as shown in FIG. 49, a resist 20B for the external connection electrodes 21B are formed by attaching a dry film on the surfaces of the external connection electrode 21A and the resist 20A and by patterning the dry film. Here, in the resist 20B, openings 20c are provided at the parts for forming the external connection electrode 21B.

Figure 50:
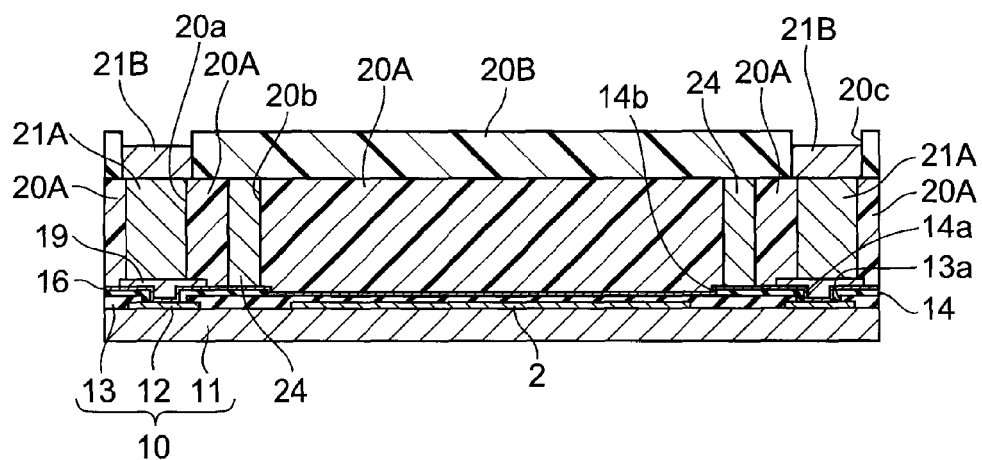
FIG. 50 is an explanatory diagram of the manufacturing method of the semiconductor structure 1C.

Next, as shown in FIG. 50, the external connection electrodes 21B are formed in the openings 20c of the resist 20B by carrying out electroplating by setting the electroplating seed layer 16 as a negative electrode.

Figure 51:
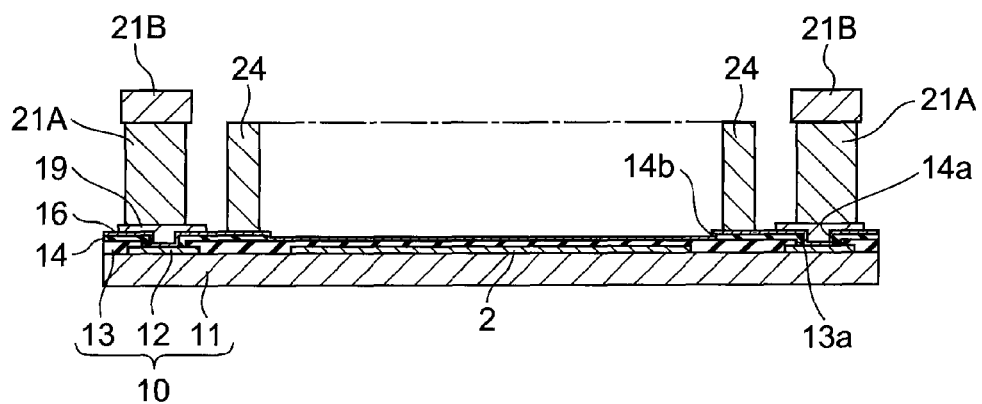
FIG. 51 is an explanatory diagram of the manufacturing method of the semiconductor structure 1C.

Then, as shown in FIG. 51, the resists 20A and 20B are removed.

Subsequently, as shown in FIGS. 52 to 53, the electroplating seed layer 16 in the region where the wiring layer 19, the external connection electrodes 21 and the wall layer 24 are not formed is removed by carrying out soft etching to form the wirings 15 and the walls 23. Thereafter, openings 13b for exposing the electronic circuits 2 are formed in the protective insulating film 13 by carrying out photolytography.

At this time, the surfaces of the wiring layer 19, the external connection electrodes 21 and the wall layer 24 are also etched. However, because the wiring layer 19, the external connection electrodes 21 and the wall layer 24 are considerably thicker than the electroplating seed layer 16, there is no affect.

Next, a visual inspection is carried out to confirm whether there are breaks in the wirings 15 or not and whether there are foreign substances on the semiconductor substrate 10 or not. Then, by carrying out the oxygen plasma treatment to the surface of the insulating film 14, foreign substances such as carbides and the like on the surface are removed.

Thereafter, as shown in FIGS. 54 and 55, lids 25C which cover the regions inside of the walls 23 (the device region) are place on the walls 23. The lids 25C are connected to each other by the connecting units 25a.

Next, as shown in FIGS. 56 and 57, a sealing resin 22 is filled in the region outside of the walls 23 (the wiring region) and on the lids 25C. At this time, because the regions inside of the walls 23 (the device region) are covered with the lids 25C, the regions inside of the walls 23 will not be filled with the sealing resin 22 (the sealing resin 22 slightly enters between the upper surface of the walls 23 and the lower surface of the lids 25C).

Next, by trimming the sealing resin 22 from the upper surface, the external connection electrodes 21B, the sealing resin 22 and the lids 25C are formed so that the surfaces thereof are at the same surface level with each other. Thereafter, by carrying out dice cutting, the semiconductor structure 1C as shown in FIGS. 45 and 46 is completed.

The completed semiconductor structure 1C is used to carry out the procedures shown in FIGS. 21 to 30 in the similar way as in the procedures for the semiconductor device 100A of the first embodiment. With that, the semiconductor device 100C is completed.

According to the embodiment, the semiconductor structure 1C in which the region (the device region) of the semiconductor substrate 10 inside of the wall 23, the wall 23 encircling the device region in which the electronic circuit 2 is formed, is sealed by the lid 25C is used. Therefore, the semiconductor structure 1C can be packaged in the semiconductor device 100C in a state where the device region in which the electronic circuit 2 is formed is hollow. Therefore, the present invention can be applied for the package in which a mechanical device is to be sealed.

The entire disclosure of Japanese Patent Application No. 2010-075037 filed on Mar. 29, 2010 including description, claims, drawings, and abstract are incorporated herein by reference in its entirety.

Although various exemplary embodiments have been shown and described, the invention is not limited to the embodiments shown. Therefore, the scope of the invention is intended to be limited solely by the scope of the claims that follow.

What is claimed is:

1. A semiconductor structure, comprising:
   a semiconductor substrate including an electronic circuit which is provided in a predetermined region of the semiconductor substrate;
   a wiring provided on the semiconductor substrate in a region outside of the predetermined region;
   an external connection electrode provided on the wiring;
   a sealing resin which covers a side surface of the external connection electrode; and
   a wall which intervenes between the electronic circuit and the sealing resin;
   wherein the wall and the external connection electrode are formed of a same material.

2. The semiconductor structure according to claim 1, wherein the predetermined region is encircled by the wall.

3. The semiconductor structure according to claim 1, wherein an upper surface of the wall and an upper surface of the external connection electrode are at a same surface level.

4. The semiconductor structure according to claim 1, wherein an upper surface of the sealing resin and an upper surface of the external connection electrode are at a same surface level.

5. The semiconductor structure according to claim 1, wherein the wall is grounded.

6. The semiconductor structure according to claim 5, wherein the semiconductor substrate includes a connection pad for grounding and the connection pad for grounding is connected to the wall via a wiring for grounding.

7. A semiconductor device, comprising:
   a semiconductor structure which comprises:
      a semiconductor substrate including an electronic circuit which is provided in a predetermined region of the semiconductor substrate;

a wiring provided on the semiconductor substrate outside of the predetermined region;

an external connection electrode provided on the wiring;

a sealing resin which covers a side surface of the external connection electrode; and a wall which intervenes between the electronic circuit and the sealing resin, an intermediate insulating layer provided around the semiconductor structure, and a lower insulating layer which is in contact with an under surface of the intermediate insulating layer and an under surface of the semiconductor structure.

8. The semiconductor device according to claim 7, further comprising an upper insulating layer on an upper surface of the intermediate insulating layer.

9. The semiconductor device according to claim 8, wherein the upper insulating layer covers a region of the semiconductor structure excluding the predetermined region.

10. The semiconductor device according to claim 9, wherein the upper insulating layer includes via holes, and a wiring which is connected to the external connection electrode via the via voles is provided on the upper insulating layer.

11. The semiconductor device according to claim 8, wherein the upper insulating layer has an opening at a position corresponding to the predetermined region of the semiconductor structure.

12. The semiconductor device according to claim 7, wherein a transparent resin is filled inside of the wall to seal the predetermined region.

13. The semiconductor device according to claim 7, further comprising a lid arranged on the wall to seal an upper space of the predetermined region.

14. The semiconductor device according to claim 13, wherein the lid is transparent.

* * * * *